United States Patent
Chen et al.

(10) Patent No.: US 11,854,978 B2
(45) Date of Patent: Dec. 26, 2023

(54) DIAGONAL BACKSIDE POWER AND SIGNAL ROUTING FOR AN INTEGRATED CIRCUIT

(71) Applicant: Taiwan Semiconductor Manufacturing Company, Ltd., Hsinchu (TW)

(72) Inventors: Sheng-Hsiung Chen, Zhubei (TW); Jerry Chang Jui Kao, Taipei (TW); Kuo-Nan Yang, Hsinchu (TW); Jack Liu, Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 227 days.

(21) Appl. No.: 17/332,072

(22) Filed: May 27, 2021

(65) Prior Publication Data
US 2022/0384344 A1 Dec. 1, 2022

(51) Int. Cl.
| | | |
|---|---|---|
| *H01L 23/528* | (2006.01) | |
| *H01L 23/522* | (2006.01) | |
| *G06F 30/394* | (2020.01) | |
| *G06F 30/392* | (2020.01) | |
| *H01L 21/768* | (2006.01) | |

(52) U.S. Cl.
CPC ........ *H01L 23/5286* (2013.01); *G06F 30/392* (2020.01); *G06F 30/394* (2020.01); *H01L 21/76877* (2013.01); *H01L 23/5226* (2013.01)

(58) Field of Classification Search
CPC .......... H01L 23/5286; H01L 21/76877; H01L 23/5226; H01L 23/5225; H01L 23/528; H01L 21/76838; H01L 21/82; H01L 2221/1068; G06F 30/392; G06F 30/394
See application file for complete search history.

(56) References Cited

U.S. PATENT DOCUMENTS

| | | | |
|---|---|---|---|
| 10,189,705 B1* | 1/2019 | Campanella Pineda ..................... | B81C 1/00246 |
| 2010/0229142 A1* | 9/2010 | Masleid ................ | G06F 30/394 361/752 |

* cited by examiner

*Primary Examiner* — Karen Kusumakar
(74) *Attorney, Agent, or Firm* — MERCHANT & GOULD P.C.

(57) ABSTRACT

An integrated circuit includes a device, a first interconnect structure disposed above the device and a second interconnect structure positioned below the device. The first interconnect structure includes multiple frontside metal layers. The second interconnect structure includes multiple backside metal layers, where each backside metal layer includes metal conductors routed according to diagonal routing. In some embodiments, a backside interconnect structure can include another backside metal layer that includes metal conductors routed according to mixed-Manhattan-diagonal routing. A variety of techniques can be used to route signals between metal conductors in the backside interconnect structure and cells on one or more frontside metal layers.

20 Claims, 22 Drawing Sheets

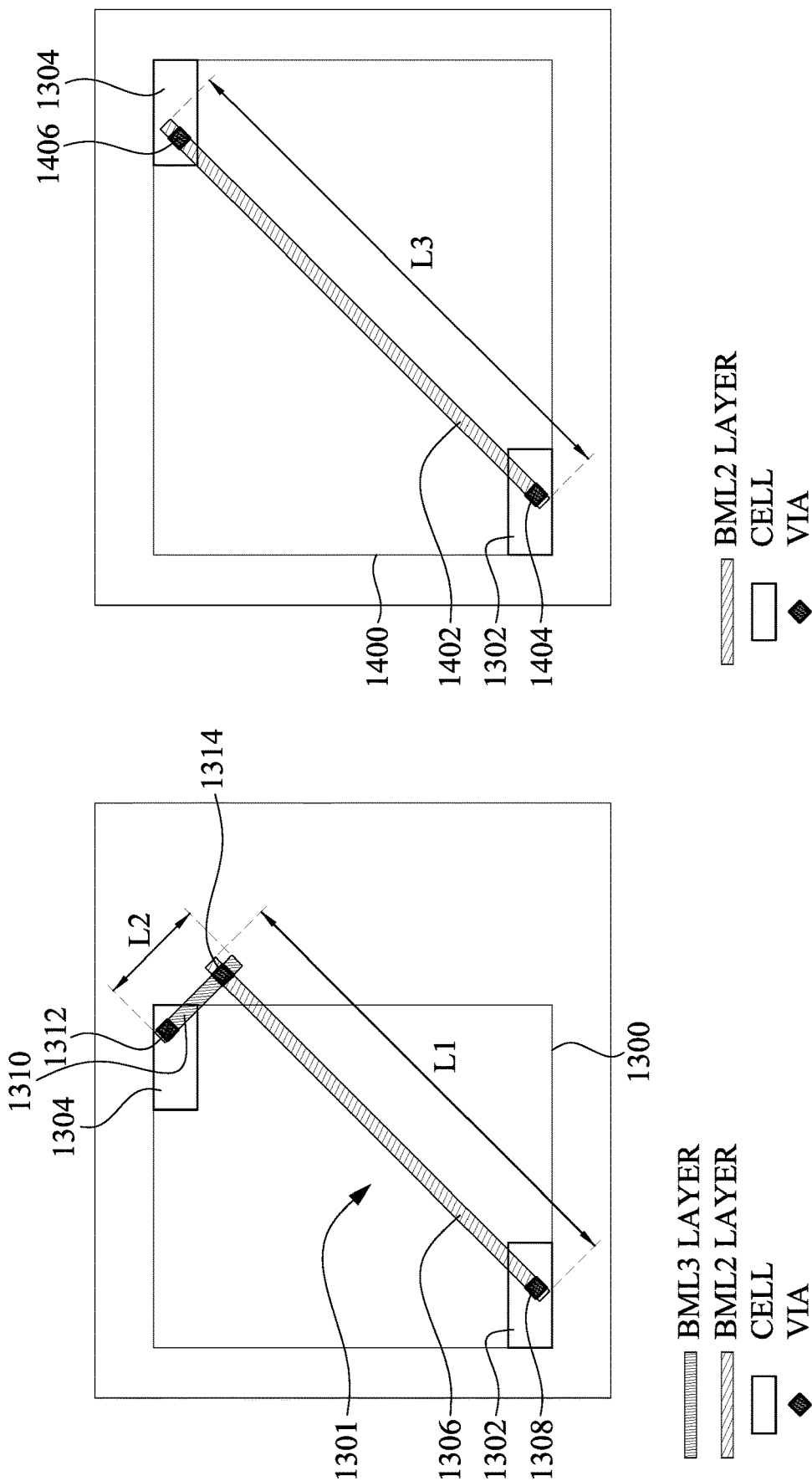

DIAGONAL BACKSIDE POWER AND SIGNAL ROUTING FOR AN INTEGRATED CIRCUIT

BACKGROUND

An integrated circuit includes a substrate, one or more circuits above the substrate, and metal lines that interconnect the components of a circuit and/or interconnect one circuit to another circuit. Prior to fabrication of the semiconductor device, a layout of the metal conductors in the integrated circuit is created. The metal conductors route signals and power to the components in the integrated circuit. The metal conductors that route voltage sources are part of a power delivery network that distributes one or more voltages to the active components in the integrated circuit. However, in some instances, conventional layouts of the metal conductors do not route the signals and the power efficiently.

BRIEF DESCRIPTION OF THE DRAWINGS

Aspects of the present disclosure are best understood by the following detailed description in conjunction with the accompanying drawings, where like reference numerals designate like structural elements. It is noted that various features in the drawings are not drawn to scale. In fact, the dimensions of the various features may be arbitrarily increased or reduced for clarity of discussion.

FIG. 13 illustrates a third example net and a net bounding box in accordance with some embodiments;

FIG. 14 depicts a fourth example net and a net bounding box in accordance with some embodiments;

DETAILED DESCRIPTION

Figure 1:
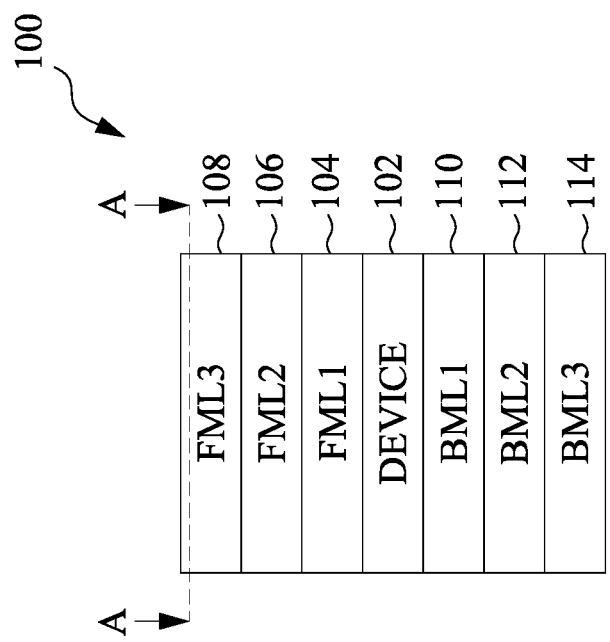
FIG. 1 illustrates an example integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "under", "upper," "top," "bottom," "front," "back," and the like, may be used herein for ease of description to describe one element or feature's relationship to another element(s) or feature(s) as illustrated in the Figure(s). The spatially relative terms are intended to encompass different orientations of the device in use or operation in addition to the orientation depicted in the figures. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, over, or under, or disposed on, over, or under another layer may be separated from the latter layer by one or more additional layers.

Integrated circuits are commonly used in various electronic devices. Integrated circuits include circuits that provide or contribute to the functionality or functionalities of the integrated circuit. Non-limiting example circuits are logic components such as a flip flop, latch, inverter, NAND, OR, AND, and NOR circuits, as well as amplifiers, buffers, and transistors. Conductive interconnects, such as metal conductors, are commonly used to route signals and voltage sources to and from the circuits (or contact pads associated with the circuits). Conventional routing schemes for the metal conductors, known as Manhattan routing, route the metal conductors orthogonally with respect to a design boundary. In a non-limiting example, the design boundary is the edges of a chip or die of the integrated circuit. However, in some instances, the orthogonal routing is not the shortest distance between two components. Embodiments disclosed herein provide various techniques for diagonal power and signal routing and diagonal clock tree routing on the backside of an integrated circuit.

In some embodiments, an integrated circuit includes a device, a first interconnect structure disposed above the device and a second interconnect structure positioned below the device. The first interconnect structure includes multiple frontside metal layers, where each frontside metal layer includes metal conductors routed according to Manhattan routing. The second interconnect structure includes multiple backside metal layers, where each backside metal layer includes metal conductors routed according to diagonal routing. In some embodiments, the backside interconnect structure can include another backside metal layer that includes metal conductors routed according to mixed-Manhattan-diagonal routing. A variety of techniques can be used to route signals between metal conductors in the backside interconnect structure and cells on one or more frontside metal layers, where a cell includes components and/or circuits of an integrated circuit.

The embodiments described herein are described with respect to metal layers, metal conductors, and poly lines. However, other embodiments are not limited to metal layers, metal conductors, and poly lines. Any suitable conductor that is made of one or more conductive materials can be used. Additionally, the conductors can be formed in one or more conductor layers.

These and other embodiments are discussed below with reference to FIGS. 1-23. However, those skilled in the art will readily appreciate that the detailed description given herein with respect to these Figures is for explanatory purposes only and should not be construed as limiting.

FIG. 1 illustrates an example integrated circuit in accordance with some embodiments. The integrated circuit 100 includes a device 102. The device 102 is implemented as one or more circuits that are formed in, on, and/or above a substrate (e.g., substrate 200 in FIG. 2). Each circuit typically includes one or more components (e.g., active components). Example circuits include, but are not limited to, a NAND circuit, a NOR circuit, an inverter, a flip flop, a latch, and/or an amplifier.

Positioned above the device 102 is a frontside first metal (FML1) layer 104. One example of a FML1 layer 104 is a M0 layer. The FML1 layer 104 includes metal conductors that route power and signals to, within, and from the device 102. In one embodiment, the metal conductors are arranged according to Manhattan routing. Manhattan routing routes the metal conductors orthogonally (vertically or horizontally) with respect to a design boundary (e.g., the edges of the chip). In other embodiments, the metal conductors can be arranged based on mixed-Manhattan-diagonal routing. Diagonal routing routes the metal conductors at one or more angles with respect to the design boundary. In one embodiment, the diagonal routings are routed at angles of forty-five (45) degrees and one hundred and thirty-five (135) degrees.

Disposed above the FML1 layer 104 is a frontside second metal (FML2) layer 106. One example of a FML2 layer 106 is a M1 layer. Like the FML1 layer 104, the FML2 layer 106 includes metal conductors that route power and signals to, within, and from the device 102. In one embodiment, the metal conductors in the FML2 layer 106 are routed according to Manhattan routing.

Positioned above the FML2 layer 106 is a frontside third metal (FML3) layer 108. One example of a FML3 layer 108 is a M2 layer. The FML3 layer 108 includes metal conductors that route power and signals to, within, and from the device 102. In one embodiment, the metal conductors in the FML3 layer are arranged according to Manhattan routing.

Disposed below the device 102 is a backside first metal (BML1) layer 110. One example of a BML1 layer 110 is a backside M0 layer. The BML1 layer 110 includes metal conductors that route power (e.g., one or more voltage sources such as VDD and VSS) and/or signals to, within, and from the device 102. In one embodiment, the metal conductors in the BML1 layer 110 are arranged according to mixed-Manhattan-diagonal routing. In another embodiment, the metal conductors are routed based on diagonal routing.

Disposed below the BML1 layer 110 is a backside second metal (BML2) layer 112. One example of a BML2 layer 112 is a backside M1 layer. The BML2 layer 112 includes metal conductors that route one or more voltage sources and/or signals to, within, and from the device 102. In one embodiment, the metal conductors in the BML2 layer 112 are routed according to mixed-Manhattan-diagonal routing. In another embodiment, the metal conductors are routed based on diagonal routing.

Positioned below the BML2 layer 110 is a backside third metal (BML3) layer 114. One example of a BML3 layer 114 is a backside M2 layer. The BML3 layer 114 includes metal conductors that route one or more voltage sources and/or signals to, within, and from the device 102. In some embodiments, the metal conductors in the BML3 layer 114 are arranged according to mixed-Manhattan-diagonal routing or diagonal routing.

Figure 2:
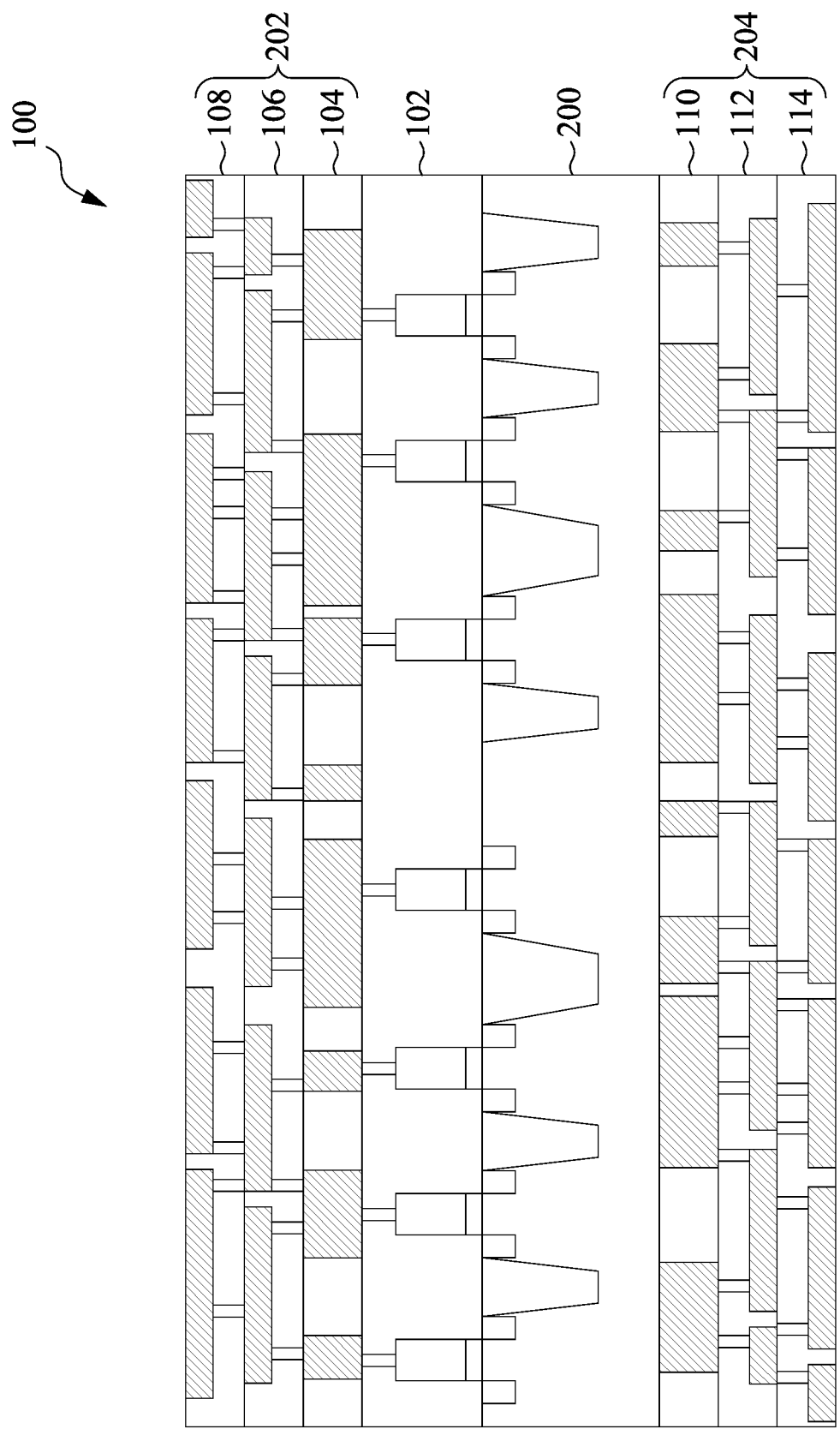
FIG. 2 depicts a cross-sectional view of the example integrated circuit taken along line A-A in FIG. 1 in accordance with some embodiments.

FIG. 2 depicts a cross-sectional view of the example integrated circuit taken along line A-A in FIG. 1 in accordance with some embodiments. The integrated circuit 100 includes a substrate 200, the device 102, a frontside interconnect structure 202, and a backside interconnect structure 204. The substrate 200 is implemented with any suitable substrate. For example, the substrate 200 can be a semiconductor substrate, a gallium nitride substrate, or a silicon carbide substrate.

The frontside interconnect structure 202 includes the FML1 layer 104, the FML2 layer 106, and the FML3 layer 108. Each frontside metal layer 104, 106, 108 includes metal conductors that interconnect a component of the device 102 to another component of the device 102 and/or to one or more power sources (e.g., VDD and VSS). In one embodiment, the metal conductors in at least one frontside metal layer 104, 106, 108 are implemented as metal lines. Additionally or alternatively, the metal conductors in at least one frontside metal layer 104, 106, 108 are configured as metal pillars.

The backside interconnect structure 204 includes the BML1 layer 110, the BML2 layer 112, and the BML3 layer 114. Each backside metal layer 110, 112, 114 includes metal conductors that route one or more power sources (e.g., VDD and VSS) within the integrated circuit 100. At least one of the backside metal layers 110, 112, 114 can also route signals between the components of the device 102. In one embodiment, the metal conductors in at least one backside metal layer 110, 112, 114 are implemented as metal lines. Additionally or alternatively, the metal conductors in at least one backside metal layer 110, 112, 114 are configured as metal pillars. Although FIGS. 1 and 2 present three frontside and three backside metal layers 104, 106, 108, 110, 112, 114, other embodiments can include any number of frontside and backside metal layers.

Figure 3:
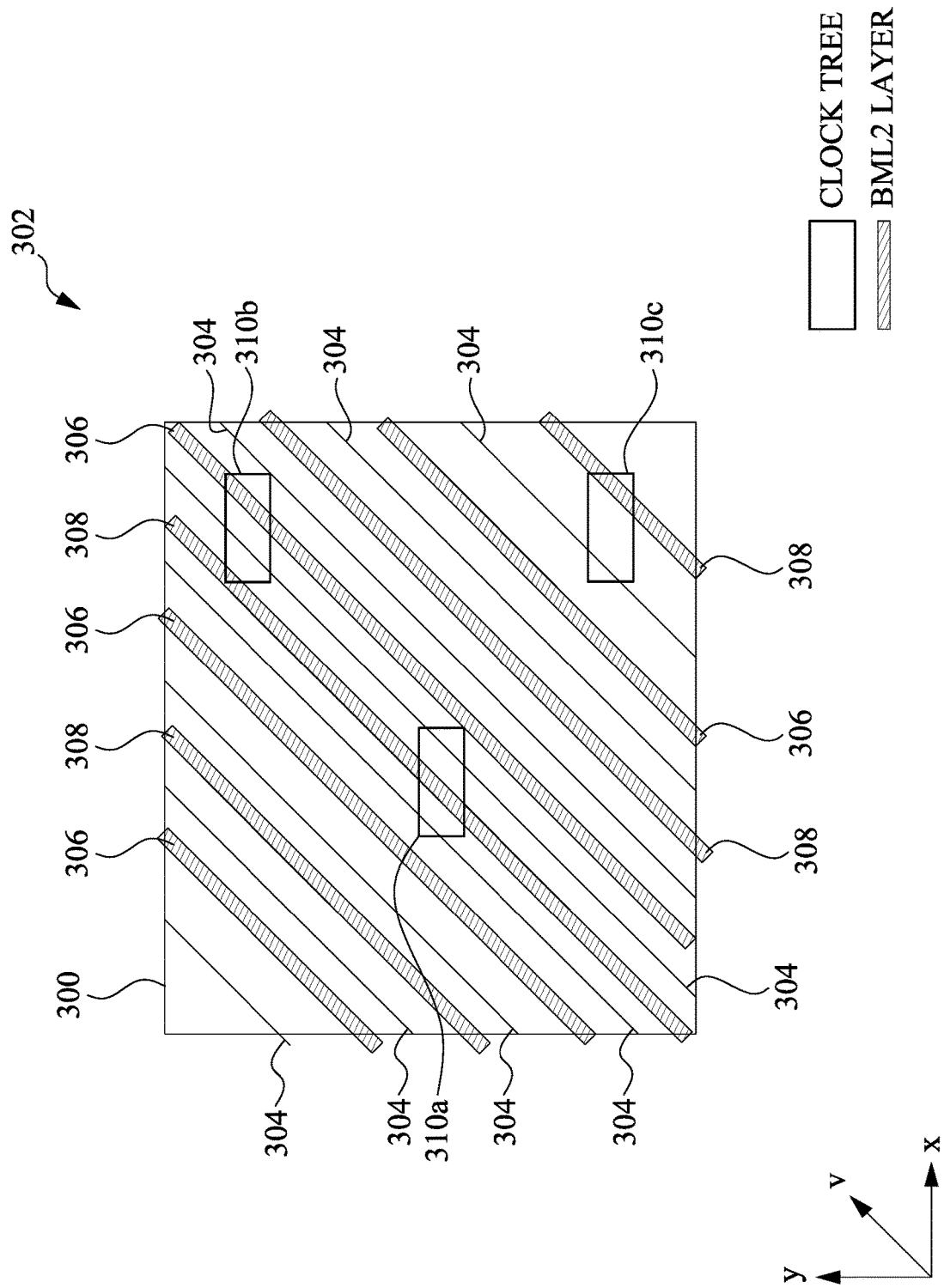
FIG. 3 illustrates an example layout of a first backside metal layer in accordance with some embodiments.

FIG. 3 illustrates an example layout of a first backside metal layer in accordance with some embodiments. In a non-limiting example, the first backside metal layer 300 is the BML2 layer (e.g., BML2 layer 112 in FIG. 1). The layout 302 includes tracks 304, diagonal metal conductors 306, and diagonal metal conductors 308. The tracks 304 represent paths or routes in which the diagonal metal conductors 306, 308 can be positioned along on the first backside metal layer 300. In the illustrated embodiment, the tracks 304 are oriented diagonally along a v direction. The diagonal metal conductors 306, 308 are disposed along some of the tracks 304. Since the diagonal metal conductors 306, 308 are disposed over the tracks 304, the tracks 304 that are below the diagonal metal conductors 306, 308 are not visible in FIG. 3. In one embodiment, the v direction is forty-five (45) degrees, the diagonal metal conductors 306 are configured to connect to one power source to route one power signal (e.g., VDD), and the diagonal metal conductors 308 are configured to connect to another power source to route a different power signal (e.g., VSS or ground).

The first backside metal layer 300 also include clock trees 310a, 310b, 310c. Each clock tree 310a, 310b, 310c includes clocking circuitry and devices that distribute timing signals around an integrated circuit. Since an integrated circuit typically uses multiple power sources that have different clock performance requirements and frequencies, the term "clock tree" refers to the multiple clocks that are used to meet the requirements of the integrated circuit.

Figure 4:
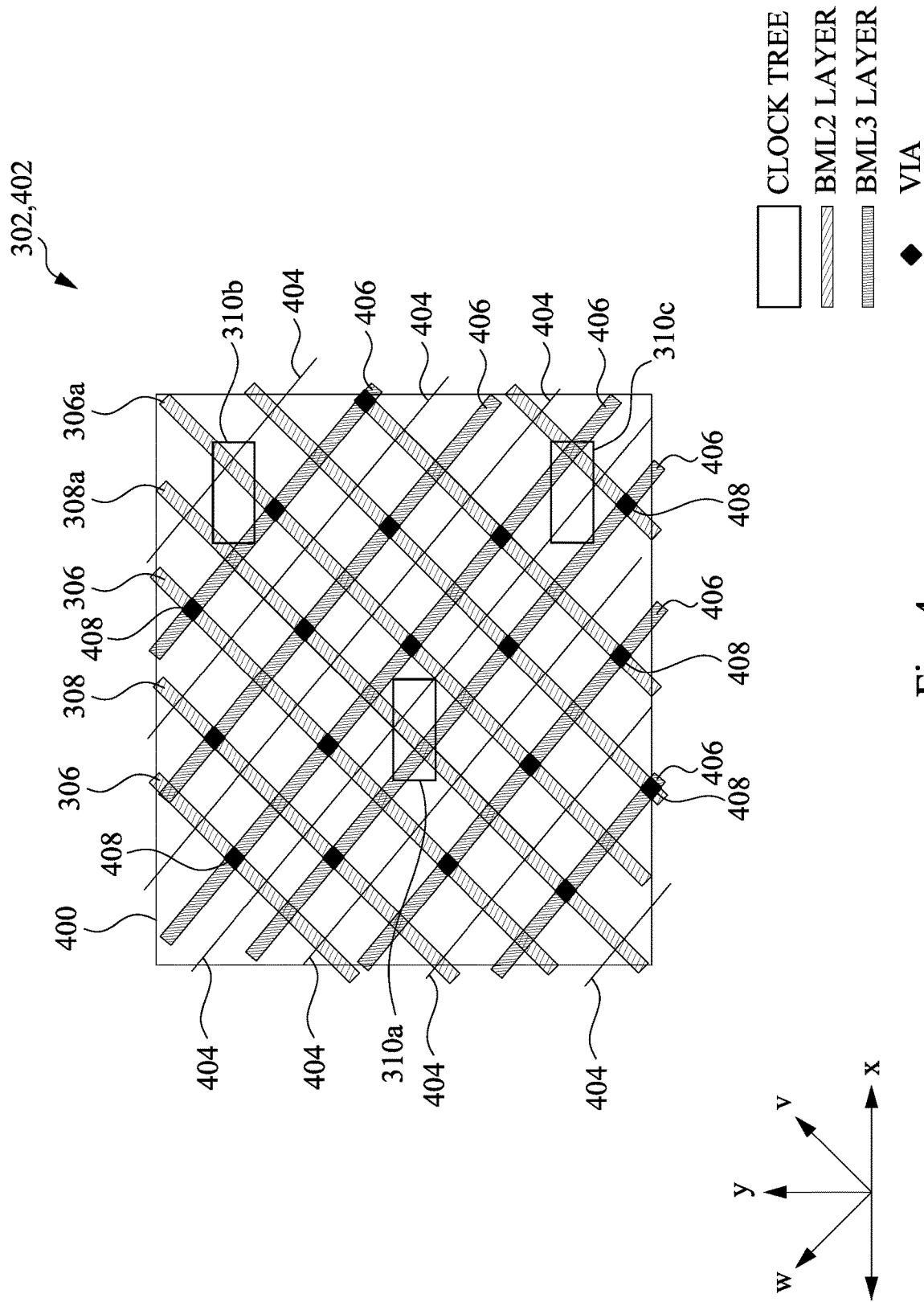
FIG. 4 depicts the example layout of the first backside metal layer shown in FIG. 3 and an example layout of a second backside metal layer in accordance with some embodiments.

FIG. 4 depicts the example layout of the first backside metal layer shown in FIG. 3 and an example layout of a second backside metal layer in accordance with some embodiments. In a non-limiting example, the second backside metal layer 400 is the BML3 layer (e.g., BML3 layer 114 in FIG. 1). The layouts 302, 402 include the layout 302 shown in FIG. 3 and an example layout 402 for the second backside metal layer 400. The layout 402 includes tracks 404 and diagonal metal conductors 406. In the illustrated embodiment, the tracks 404 are oriented diagonally along a w direction. The diagonal metal conductors 406 are disposed along some of the tracks 404. Since the diagonal metal conductors 406 are disposed over the tracks 404, the tracks 404 that are below the diagonal metal conductors 406 are not visible in FIG. 4.

FIG. 4 also shows vias 408 that electrically connect respective diagonal metal conductors 406 to respective diagonal metal conductors 306, 308 on the first BML1 layer 300. When one or both diagonal metal conductors 306, 308 on the first backside metal layer 300 are configured to connect to a power source to transmit a power signal, the vias 408 enable the respective diagonal metal conductors 406 on the second backside metal layer 400 to transmit the power signal. In one embodiment, the w direction is one hundred and thirty-five (135) degrees and the diagonal metal conductors 406 route one or more power sources (e.g., VDD or VSS).

Figure 5:
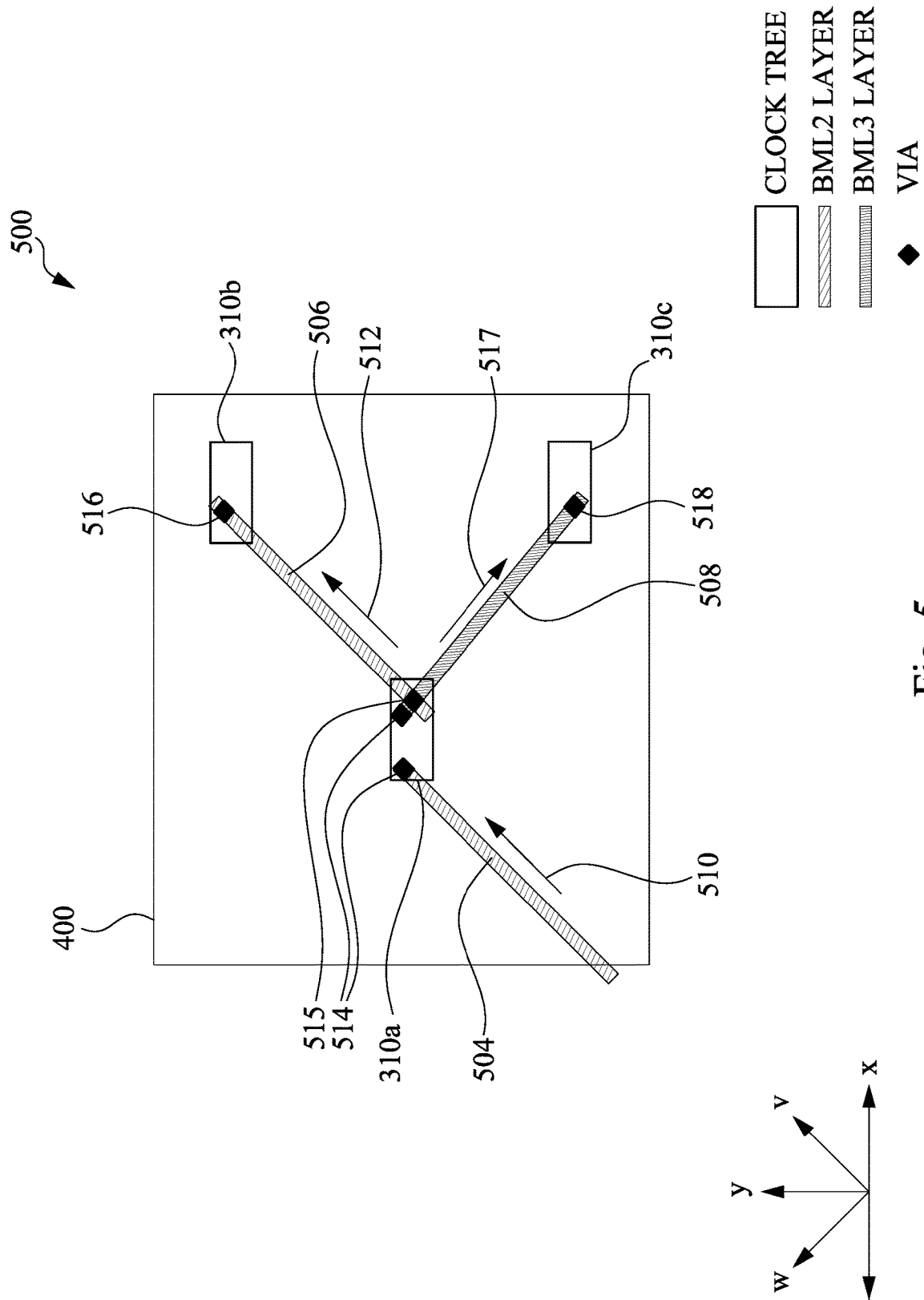
FIG. 5 illustrates an example routing between backside diagonal clock trees in accordance with some embodiments.

FIG. 5 illustrates an example routing between backside diagonal clock trees in accordance with some embodiments. In one embodiment, the example layout 500 is implemented in the second backside metal layer 400 shown in FIG. 4. The layout 500 includes the clock trees 310a, 310b, 310c shown in FIG. 3. The diagonal metal conductors 504, 506 are included on the first backside metal layer 300 (FIG. 3) and are routed along the v direction. The diagonal metal conductor 508 is included on the second backside metal layer 400 and is routed along the diagonal w direction.

The diagonal metal conductor 504 is configured to route clock signals to the clock tree 310a (indicated by arrow 510). The diagonal metal conductor 506 is configured to connect to a clock circuit to route clock signals from the clock tree 310a to the clock tree 310b (indicated by arrow 512). The diagonal metal conductor 508 is configured to connect to a clock circuit to route clock signals from the clock tree 310a to the clock tree 310c, as indicated by arrow 517. Vias 514 electrically connect the diagonal metal conductors 504, 506 to circuitry in the clock tree 310a. Via 516 electrically connects the diagonal metal conductor 506 to circuitry in the clock tree 310b. Via 518 electrically connects the diagonal metal conductor 508 to circuitry in the clock tree 310c. Via 515 electrically connects the diagonal metal conductor 508 in the second backside metal layer 400 to the diagonal metal conductor 506 in the first backside metal layer 300. The via 515 enables the diagonal metal conductor 508 on the second backside metal layer 400 to transmit the clock signal(s) on the diagonal metal conductor 506 on the first backside metal layer 300.

Figure 6:
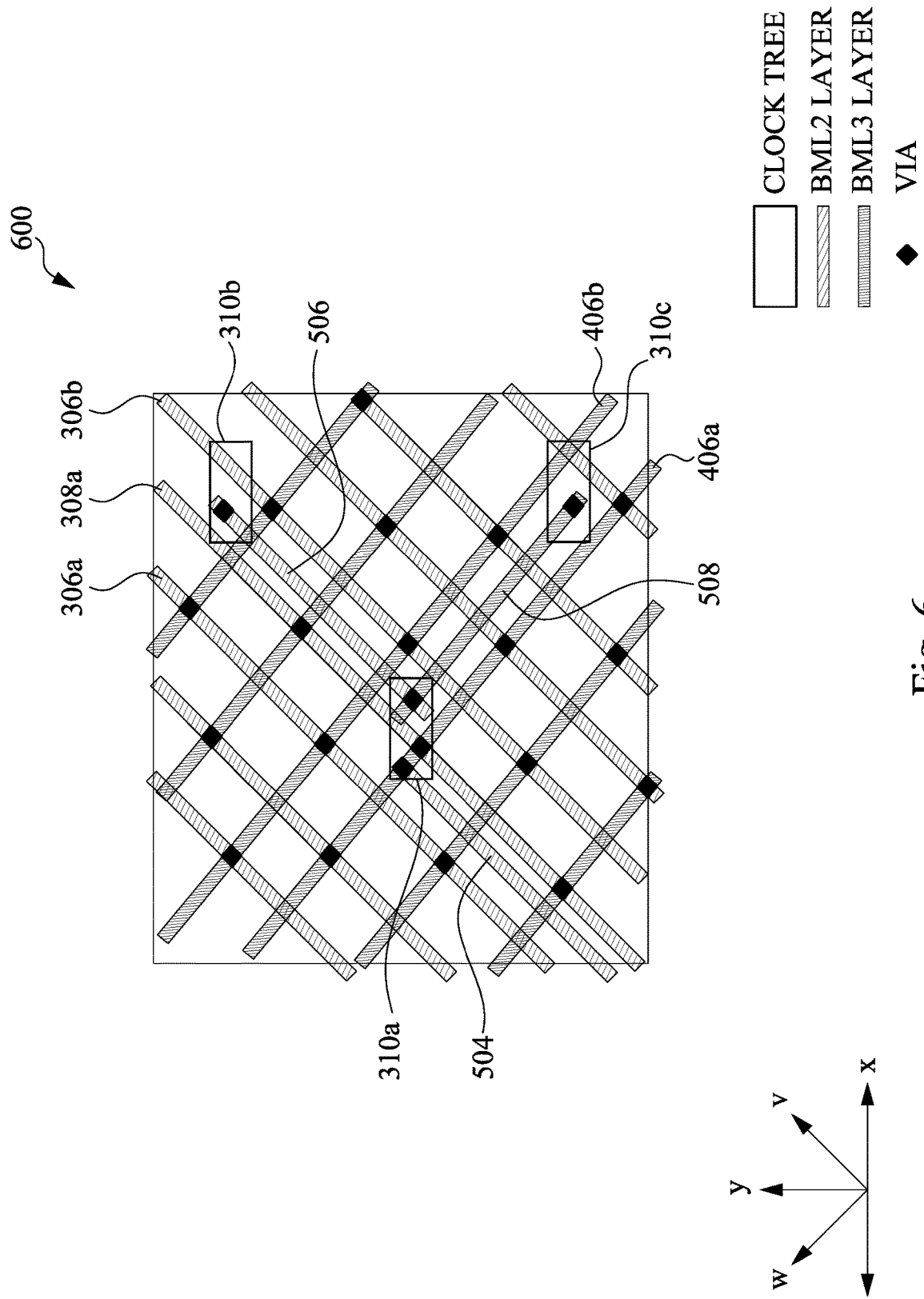
FIG. 6 depicts the example routing between the backside diagonal clock trees shown in FIG. 5 and a layout 600 of the second backside metal layer shown in FIG. 4 and a third backside metal layer in accordance with some embodiments.

FIG. 6 depicts the example routing between the backside diagonal clock trees shown in FIG. 5 and the layouts of the first and the second backside metal layers shown in FIGS. 3 and 4 in accordance with some embodiments. The diagonal metal conductor 504 is positioned along a track that is between the diagonal metal conductors 306a, 308a on the first backside metal layer 300 (e.g., track 304 in FIG. 3). The diagonal metal conductor 506 is positioned along another track that is between the diagonal metal conductors 306b, 308a on the first backside metal layer 300 (e.g., track 304 in FIG. 3). The diagonal metal conductor 508 is positioned along a track that is between the diagonal metal conductors 406a, 406b on the second backside metal layer 400 (e.g., track 404 in FIG. 4). The diagonal metal conductors 306a, 306b, 308a, 406a, 406b shield the diagonal metal conductors 504, 506, 508 to reduce noise and/or disruptions in the clock signals that are transmitted along the diagonal metal conductors 504, 506, 508. Although not identified with reference numbers in FIG. 6, the layout 600 includes the diagonal metal conductors 306, 308, 406 on the first and the second backside metal layers 300, 400, shown in FIGS. 3 and 4, respectively. The layout 600 also depicts the vias 408 shown in FIG. 4 and the vias 514, 515, 516, 518 shown in FIG. 5 (for clarity, the reference numbers for the vias are not shown in FIG. 6).

Figure 7:
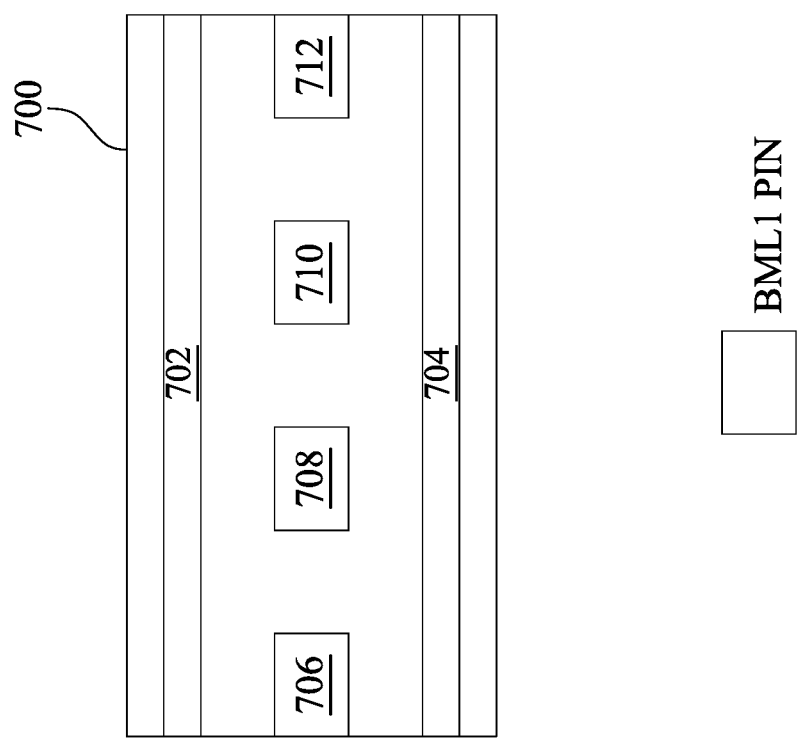
FIG. 7 illustrates an example backside pin structure for a first backside metal layer in accordance with some embodiments.

FIG. 7 illustrates an example backside pin structure for a first backside metal layer in accordance with some embodiments. In one embodiment, the first backside metal layer 700 is the BML1 layer (e.g., BML1 layer 110 in FIG. 1). The first backside metal layer 700 includes a metal conductor 702 that is configured to connect to a first power source (e.g., VDD) to provide a first power signal, and a metal conductor 704 that is configured to connect to a second power source (e.g., VSS or ground) to provide a second power signal. Pins 706, 708, 710, 712 are disposed on the first backside metal layer 700. In the illustrated embodiment, the pins 706, 708, 710, 712 have a rectangular or square shape, although other embodiments are not limited to this configuration. Additionally, pin 708 is an input pin and pin 710 is an output pin for the first backside metal layer.

Figure 8:
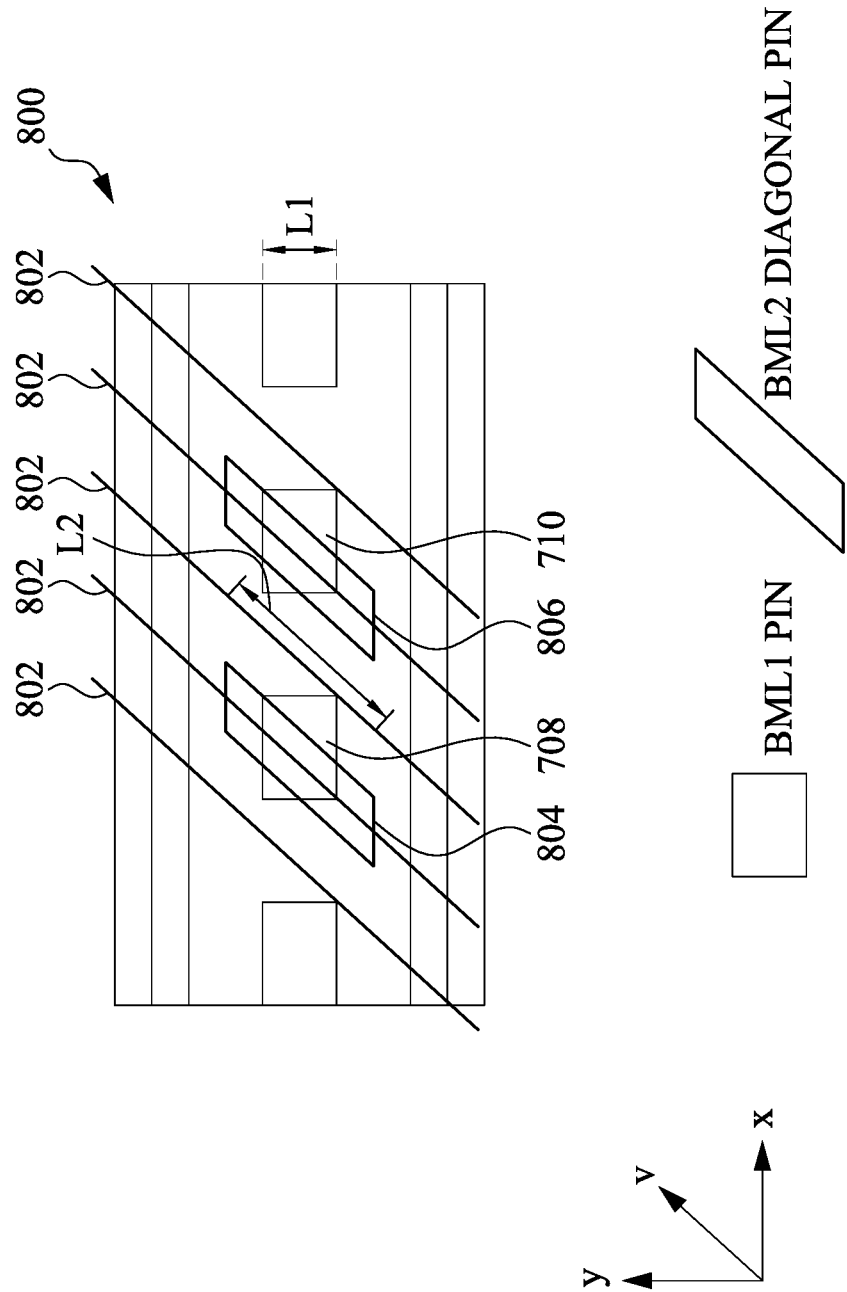
FIG. 8 depicts an example layout for backside diagonal pins in a second backside metal layer that is positioned above the first backside metal layer shown in FIG. 7 in accordance with some embodiments.

FIG. 8 depicts an example layout for backside diagonal pins in a second backside metal layer that is positioned above the first backside metal layer shown in FIG. 7 in accordance with some embodiments. In an example embodiment, the first backside layer is the BML1 layer and the second backside metal layer is the BML2 layer 112 (FIG. 1). The layout 800 includes tracks 802 for the second backside metal layer and diagonal pins 804, 806 disposed along two of the tracks 802. In the illustrated embodiment, the tracks 802 are oriented diagonally along the v direction. The diagonal pins 804, 806 are aligned with the pins 708, 710, respectively, so that connections between the pins 708, 710 and the diagonal pins 804, 806 can be made. As shown, the pins 708, 710 have a length L1 that is shorter than a length L2 of the diagonal pins 804, 806. Since the pins 708, 710 are shorter in length, the diagonal pins 804, 806 improve the pin accessibility of the pins 708, 710. The pins 708, 710 are more easily accessed based on the use of the diagonal pins 804, 806 and additional connections (e.g., vias) can be made to the diagonal pins 804, 806.

Figure 9:
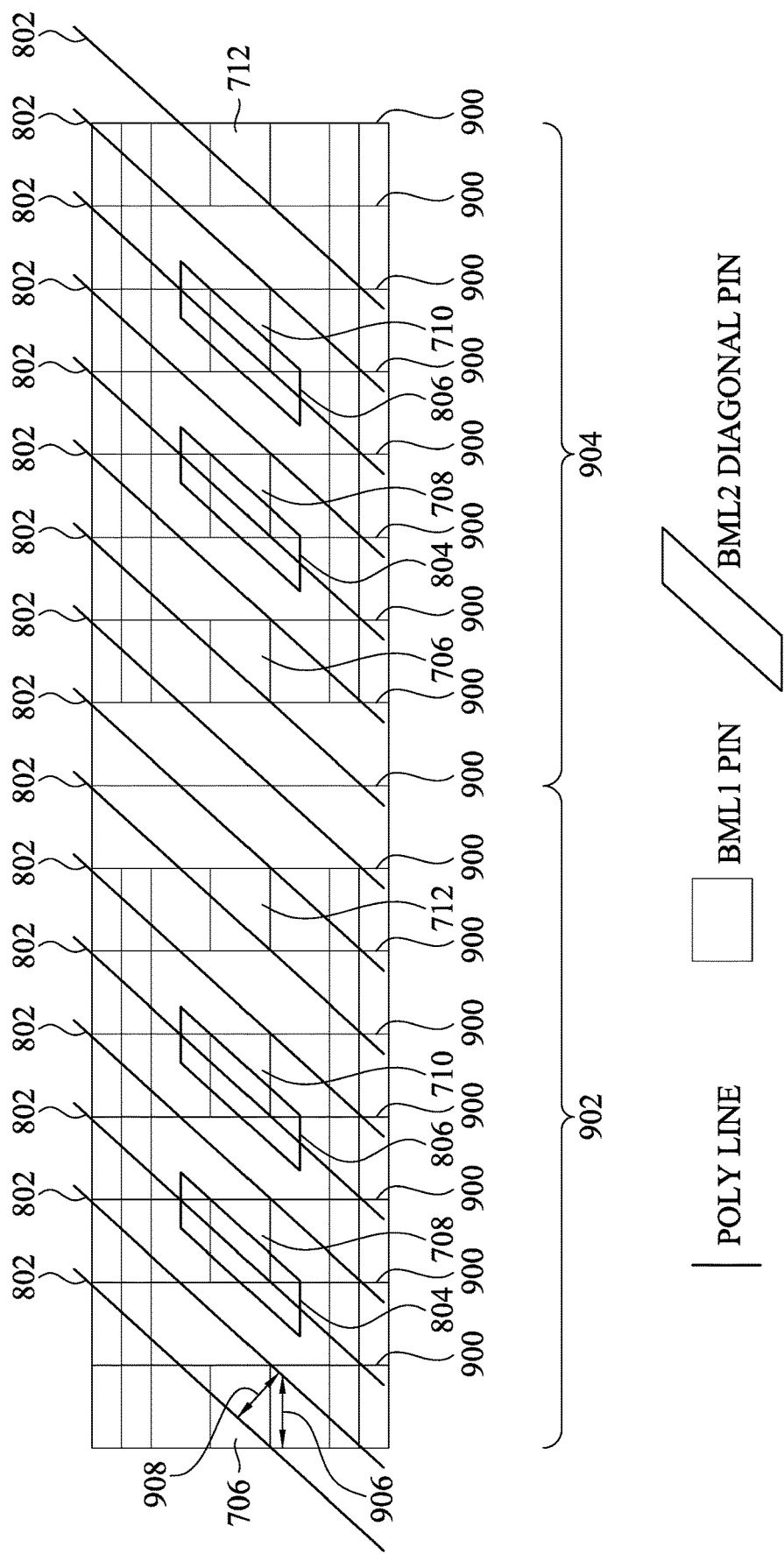
FIG. 9 illustrates an example pitch for the backside diagonal pin structure shown in FIG. 8 in accordance with some embodiments.

FIG. 9 illustrates an example pitch for the backside diagonal pin structure shown in FIG. 8 in accordance with some embodiments. Polysilicon ("poly") lines 900 are disposed above the first backside metal layer 700 between the pins 706, 708, 710, 712. In the illustrated embodiment, each cell 902, 904 includes eight (8) poly lines 900. As described earlier, the cells 902, 904 include components and/or circuits of an integrated circuit. Based on each cell 902, 904 including eight (8) poly lines 900, the contacted polysilicon pitch (CPP) 906 (e.g., the transistor gate pitch) is eight (8). Other embodiments can have any suitable CPP.

FIG. 9 also shows the tracks 802 for the second backside metal layer as shown in FIG. 8. The pitch 908 for the tracks 802 is based on the CPP 906. For example, in one embodiment, the pitch 908 is defined by Equation 1:

$$\frac{CPP \times n}{\sqrt{2}} = \text{Pitch (908)}, \quad \text{Equation 1}$$

where the variable n is a number greater than zero (0). The value of the variable n can be determined based on the placement of the diagonal pins 804, 806 with respect to the pins 708, 710 (or the tracks in the first backside metal layer (not shown in FIG. 9)). The value of the variable n can be selected to produce a given alignment between the diagonal pins 804, 806 and the tracks in the first backside metal layer. The variable n enables the diagonal pins 804, 806 to be aligned with the tracks 802.

In some embodiments, some of the nets located in the frontside of an integrated circuit are associated with time critical operations ("time critical nets"). A net represents the connection between an input (or inputs) and an output (or outputs) in a circuit or between components of a circuit in the integrated circuit. To reduce the delays in the signals transmitted through the time critical nets, the time critical nets can be promoted to a backside layer. Since the diagonal metal conductors on the backside metal layers have shorter lengths compared to the lengths of the metal conductors arranged as Manhattan routings, the diagonal metal conductors can typically transmit the signals in less time. Thus, the diagonal metal conductors on the backside metal layers enable the timing for time critical nets to be reduced or optimized.

Figure 10:
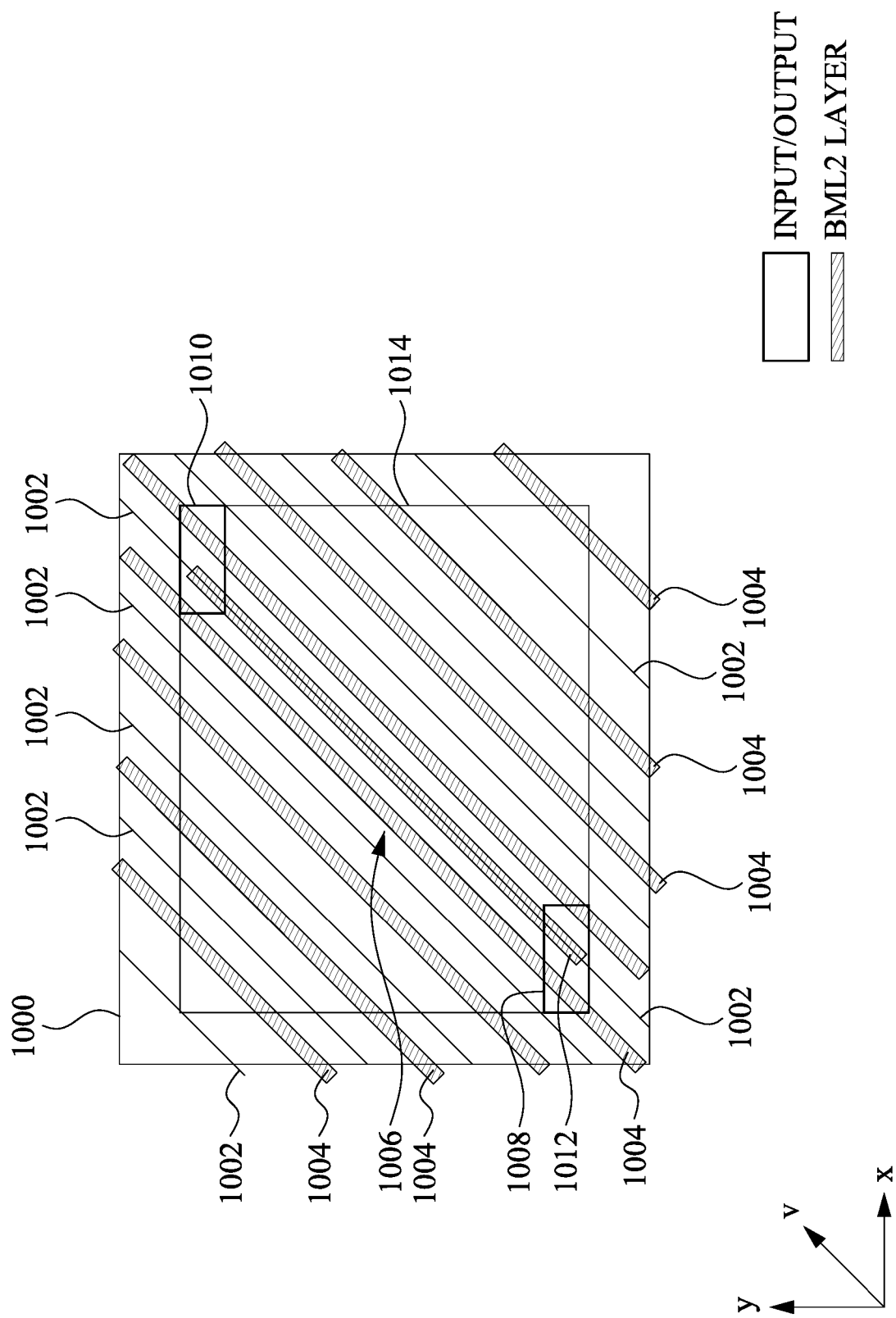
FIG. 10 depicts an example backside diagonal signal routing between two promoted nets in accordance with some embodiments.

FIG. 10 depicts an example backside diagonal signal routing between two promoted nets in accordance with some embodiments. A backside metal layer 1000 includes tracks 1002 disposed along the v direction and diagonal metal conductors 1004 positioned along some of the tracks 1002. Since the diagonal metal conductors 1004 are disposed over the tracks 1002, the tracks 1002 that are below the diagonal metal conductors 1004 are not visible in FIG. 10. In an example embodiment, the backside metal layer 1000 is the BML2 layer 112 (FIG. 1).

Figure 11:
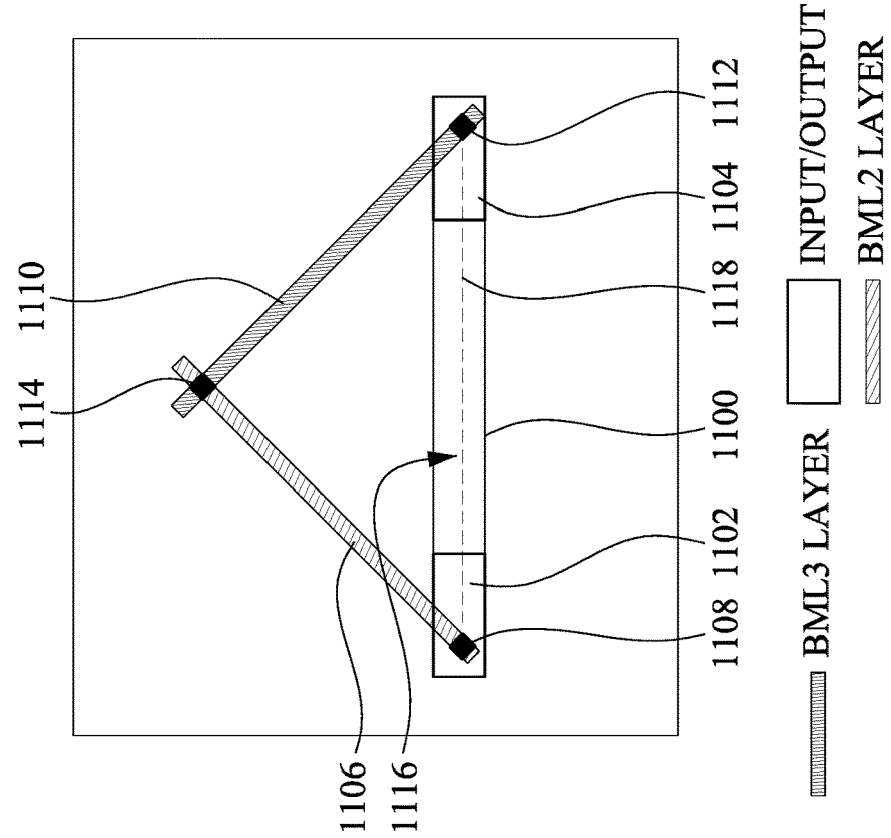
FIG. 11 illustrates a first example net and a net bounding box in accordance with some embodiments.

A net 1006 is formed with an input 1008, an output 1010, and a diagonal metal conductor 1012 connecting the input 1008 to the output 1010. A net bounding box 1014 encloses all of the outputs and inputs of the net 1006. The aspect ratio of a net bounding box can be used as an indicator or measure of whether diagonal routing is a benefit or improvement to a net or not. FIG. 11 illustrates a first example net and a net bounding box in accordance with some embodiments. The net bounding box 1100 encloses an input 1102 and an output 1104 of a net 1116. The diagonal metal conductor 1106 is electrically connected to the input 1102 using via 1108. The diagonal metal conductor 1110 is electrically connected to the output 1104 using via 1112. The diagonal metal conductor 1106 is electrically connected to the diagonal metal conductor 1110 using via 1114. The diagonal metal conductors 1106, 1110 connect the input 1102 to the output 1104. In the illustrated embodiment, the aspect ratio of the net bounding box 1100 indicates that diagonal routing is not a benefit to the net 1116 because the total length of the diagonal metal conductors 1106, 1110 is greater than a total length of a horizontal metal conductor (Manhattan routing shown as dashed line 1118) that could be used to connect the input 1102 to the output 1104. Thus, the aspect ratio of the net bounding box 1100 can be used to determine that Manhattan routing is more suited for the net 1116 than diagonal routing.

Figure 12:
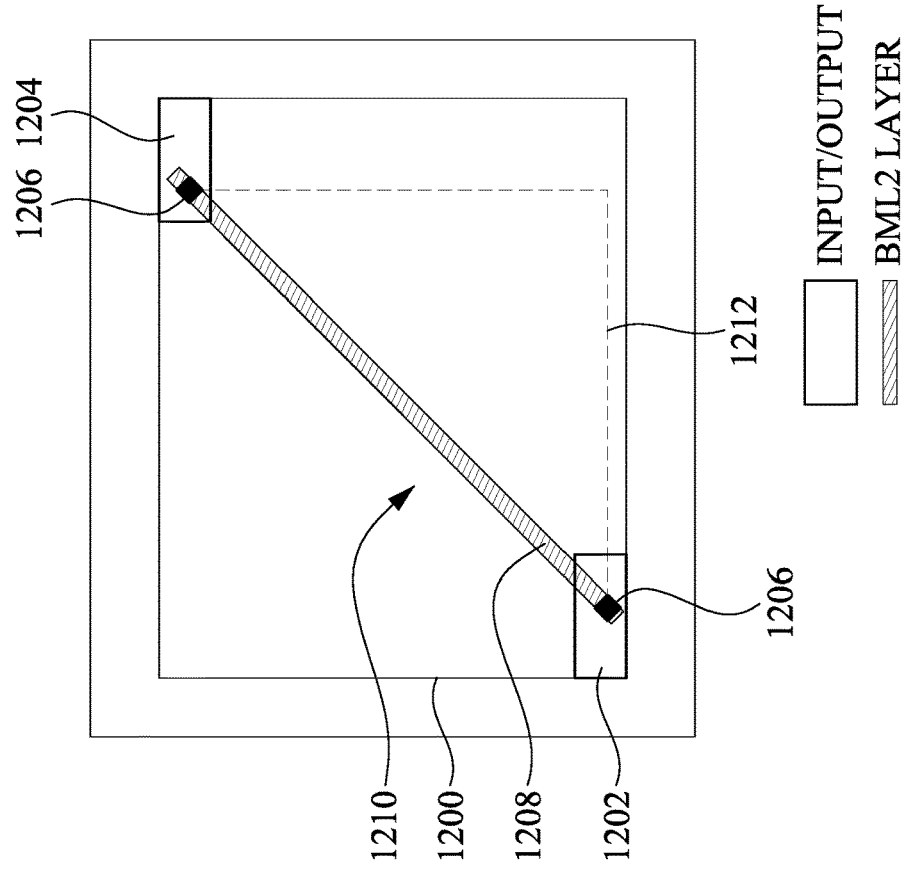
FIG. 12 depicts a second example net and a net bounding box in accordance with some embodiments.

FIG. 12 depicts a second example net and a net bounding box in accordance with some embodiments. The net bounding box 1200 encloses an input 1202 and an output 1204 of a net 1210. Vias 1206 electrically connect the diagonal metal conductor 1208 to the input 1202 and to the output 1204. In the illustrated embodiment, the aspect ratio of the net bounding box 1100 indicates that diagonal routing is a benefit to the net 1210 because the total length of the diagonal metal conductor 1208 is less than a total length of a horizontal metal conductor and a vertical metal conductor (Manhattan routing shown as dashed line 1212) that could be used to connect the input 1202 to the output 1204. Thus, the aspect ratio of the net bounding box 1200 can be used to determine that diagonal routing is more suited for the net 1210 than Manhattan routing.

Additionally or alternatively, a net bounding box can be used in some embodiments to determine a better or optimal location of a cell in order to reduce the total length of a metal conductor (or conductors) that connects an input to an output in a net. As previously noted, a cell includes components and/or circuits of an integrated circuit. FIG. 13 illustrates a third example net and a net bounding box in accordance with some embodiments. A net bounding box 1300 encloses a net 1301 that includes a cell 1302 and another cell 1304. The diagonal metal conductor 1306 electrically connects to circuitry in the cell 1302 using via 1308. The diagonal metal conductor 1310 electrically connects to circuitry in the cell

1304 using via 1312. The diagonal metal conductor 1306 is electrically connected to the diagonal metal conductor 1310 using via 1314. The diagonal metal conductors 1306, 1310 connect the cell 1302 to the cell 1304.

In the illustrated embodiment, the diagonal metal conductors 1306, 1310 have a length of L1 and L2, respectively. Thus, the total conductor length (TCL) of the diagonal metal conductors 1306, 1310 between the cell 1302 and the cell 1304 is TCL=(L1+L2). The locations of the cells 1302, 1304 produces a total conductor length of TCL. FIG. 14 depicts a fourth example net and a net bounding box in accordance with some embodiments. A net bounding box 1400 encloses the cell 1302 and the cell 1304. The diagonal metal conductor 1402 electrically connects to circuitry in the cell 1302 through via 1404 and to circuitry in the cell 1304 using via 1406. The diagonal metal conductor 1402 connects the cell 1302 to the cell 1304.

In the embodiment shown in FIG. 14, the diagonal metal conductor 1402 has a length of L3. Thus, the total conductor length (TCL) of the diagonal metal conductor 1402 between the cell 1302 and the cell 1304 is TCL=L3. When the TCL in FIG. 14 is less than the TCL in FIG. 13, the locations of the cells 1302, 1304 in FIG. 14 are better or optimal to the locations of the cells 1302, 1304 in FIG. 13 because the locations produced a lower TCL. Alternatively, when the TCL in FIG. 13 is less than the TCL in FIG. 14, the locations of the cells 1302, 1304 in FIG. 13 are better or optimal to the locations of the cells 1302, 1304 in FIG. 14 because the locations produced a lower TCL.

Figure 15:
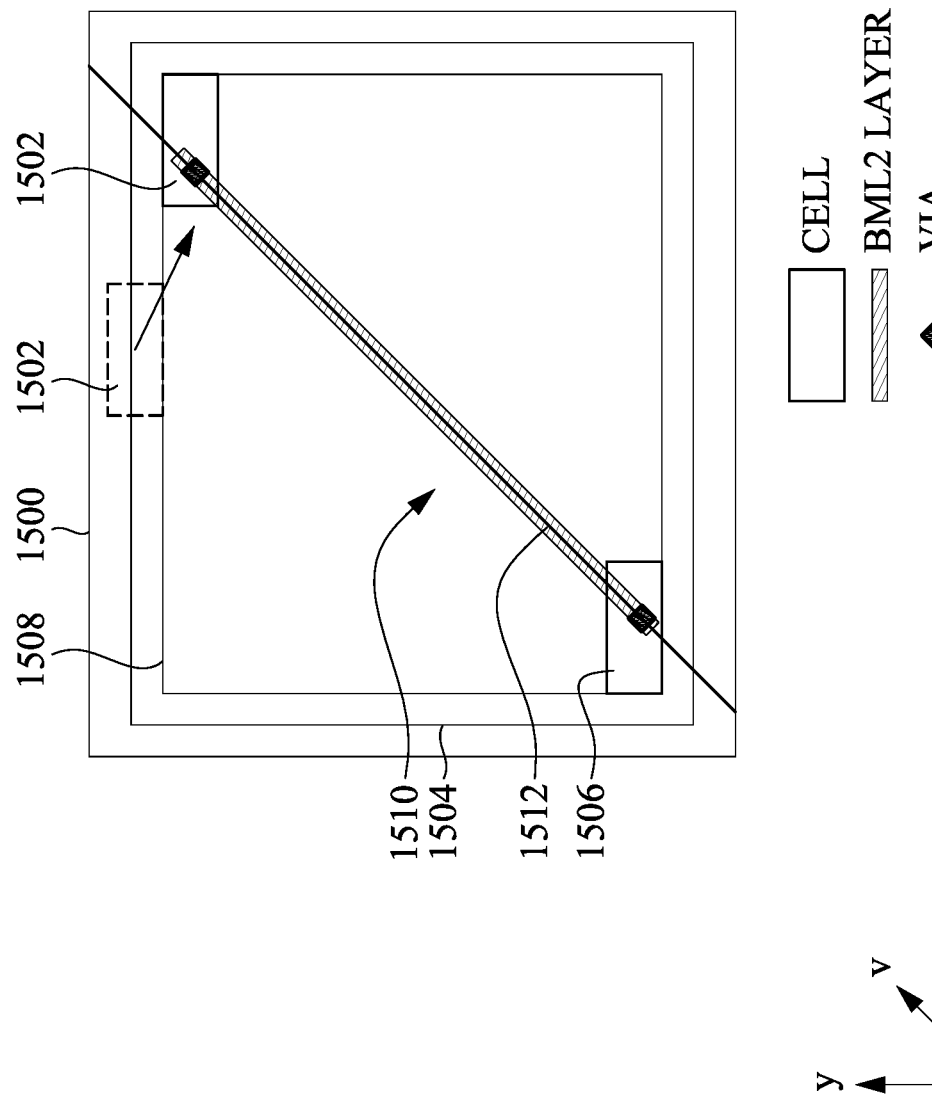
FIG. 15 illustrates example backside cell locations in accordance with some embodiments.

In some embodiments, the locations of certain cells can be selected to improve or optimize the operations of the cells. For example, certain cells can be promoted or moved to a backside metal layer to enable the cells to receive the benefits of diagonal routing, such as shorter metal conductor lengths. FIG. 15 illustrates example backside cell locations in accordance with some embodiments. A frontside layer 1500 includes a cell 1502. A backside metal layer 1504 includes the cell 1506. If the cell 1502 connects to the cell 1506, the cell 1502 can be promoted or moved (indicated by arrow) from the frontside layer 1500 to the backside metal layer 1504. For clarity, the backside metal layer 1504 is shown in FIG. 15 as having a smaller area than the frontside layer 1500. In other embodiments, the areas of the frontside layer 1500 and the backside metal layer 1504 can be the same or the area of one layer (e.g., the frontside layer 1500) can differ from the area of the other layer (e.g., the backside metal layer 1504).

A net bounding box 1508 encloses the net 1510 that includes the cells 1502, 1506. A diagonal metal conductor 1512 is disposed along the v direction and operably connects the cell 1506 to the cell 1502. Moving the cell 1502 to the backside metal layer 1504 enables the cells 1502, 1506 to benefit from diagonal routing.

Figure 16:
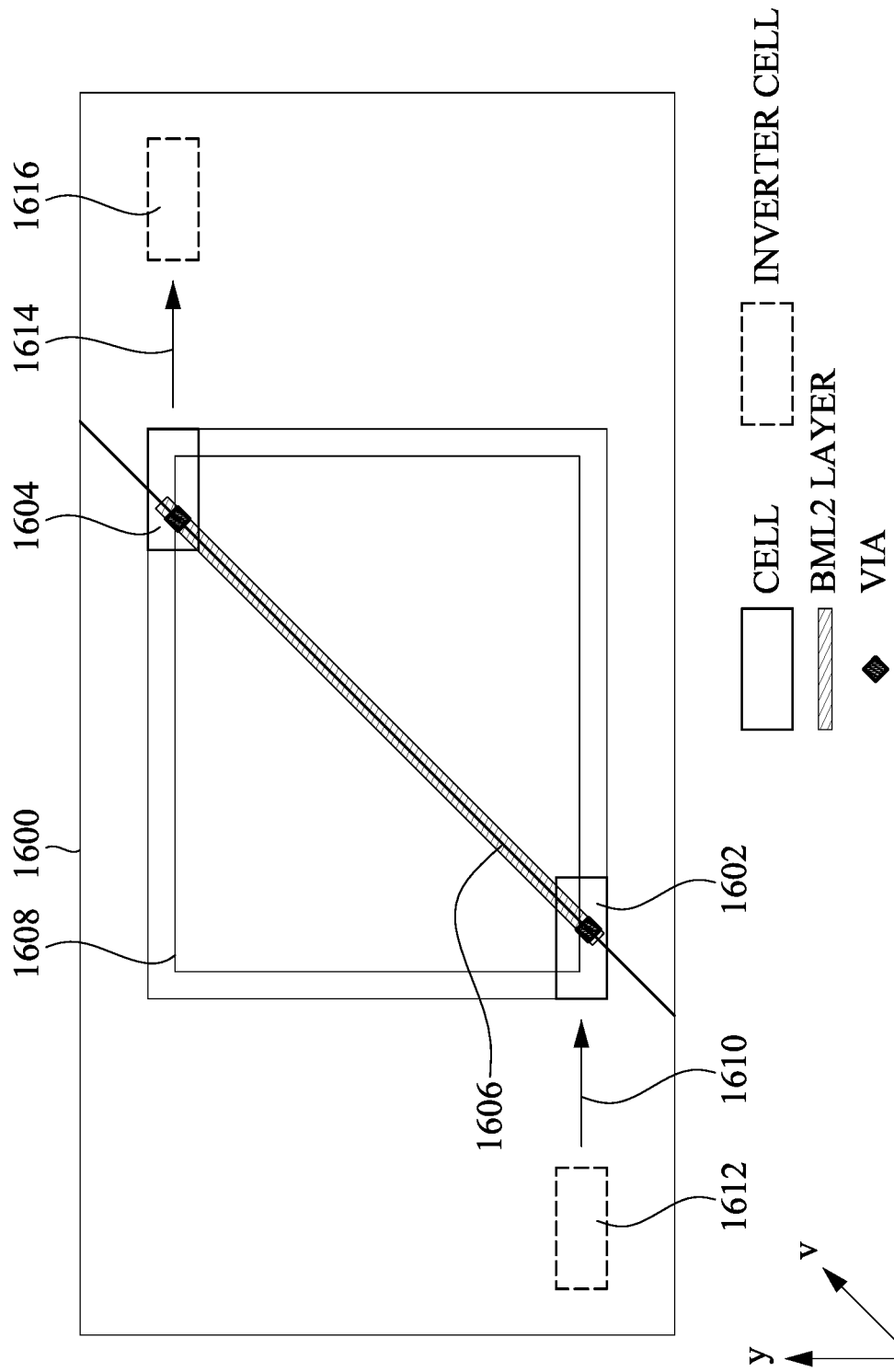
FIG. 16 depicts example inverter cells in accordance with some embodiments.

In some embodiments, some signals can be routed through a backside metal layer to receive the benefits of the diagonal routing, such as the shorter metal conductor lengths. The signals can be transmitted by one inverter cell on a frontside layer (e.g., the device 102 in FIG. 1) and received by another inverter cell on the frontside layer using a diagonal metal conductor disposed on a backside metal layer. FIG. 16 depicts example inverter cells in accordance with some embodiments. A frontside layer 1600 includes an inverter cell 1602 and another inverter cell 1604. A diagonal metal conductor 1606 on a backside metal layer 1608 connects the inverter cell 1602 to the inverter cell 1604. For clarity, the backside metal layer 1608 is shown in FIG. 16 as having a smaller area than the frontside layer 1600. In other embodiments, the areas of the frontside layer 1600 and the backside metal layer 1608 can be the same or the area of one layer (e.g., the frontside layer 1600) can differ from the area of the other layer (e.g., the backside metal layer 1608).

The inverter cells 1602, 1604 include backside pins that enable the inverter cells 1602, 1604 to transmit signals on the diagonal metal conductor 1606 and to receive signals from the diagonal metal conductor 1606. In FIG. 16, the diagonal metal conductor 1606 is positioned along the v direction, and the backside metal layer 1608 is the BML2 layer (FIG. 1).

A signal (represented by the arrow 1610) is received by the inverter cell 1602 from a cell 1612 on the frontside layer 1600. The inverter cell 1602 transmits the signal along the diagonal metal conductor 1606 to the other inverter cell 1604. The signal (represented by the arrow 1614) is then transmitted to another cell 1616 on the frontside layer 1600. In other embodiments, the cell 1616 is on a frontside layer that is different from the frontside layer 1600. The embodiment shown in FIG. 16 enables signals to be transmitted around an integrated circuit with fewer delays and/or smaller signal losses because the signals are routed through the diagonal metal conductor 1606 on the backside metal layer. The net enclosed by the net bounding box 1618 benefits from diagonal routing.

Figure 17:
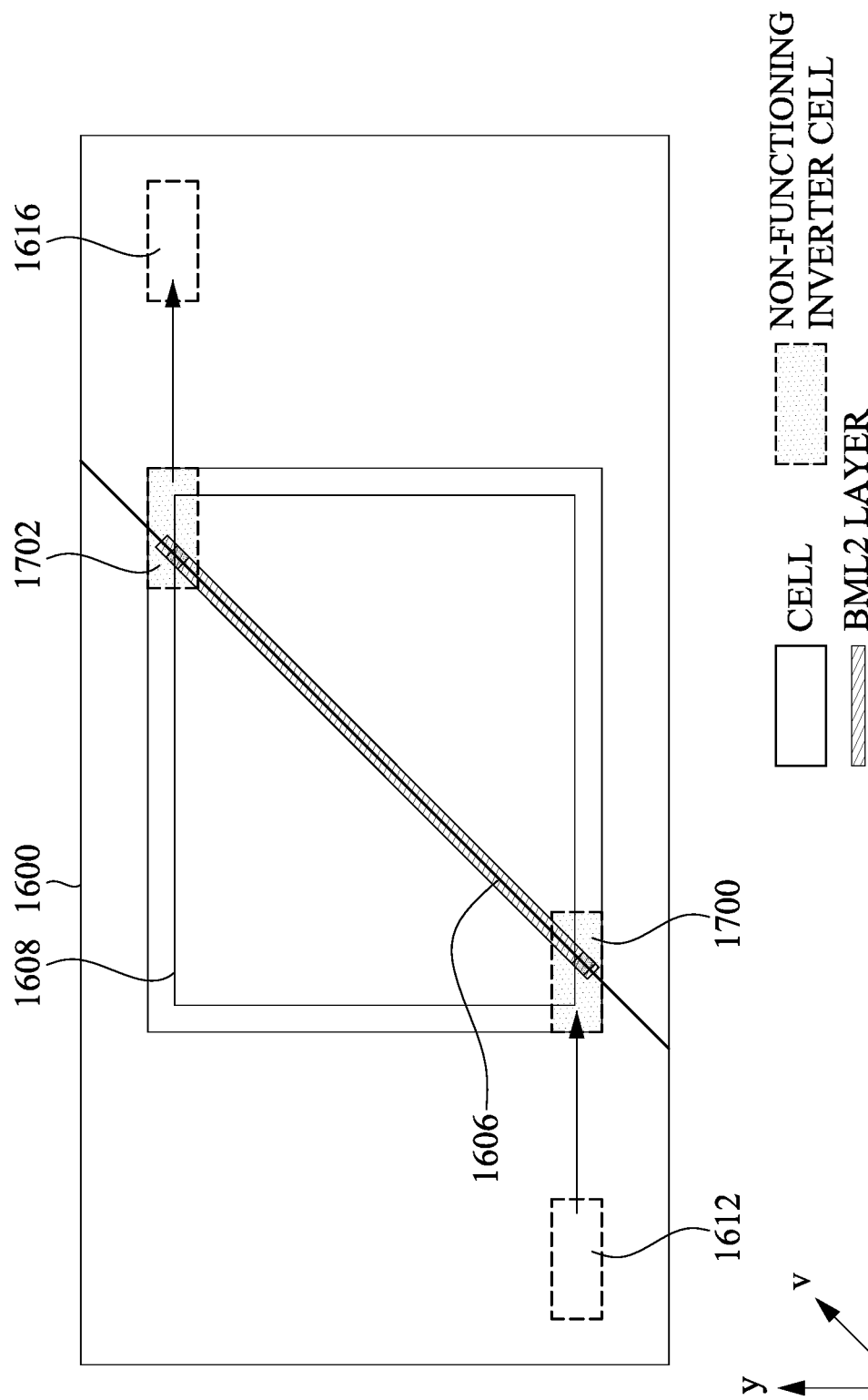
FIG. 17 illustrates example non-functioning inverter cells in accordance with some embodiments.

In some embodiments, the inverter cells 1602, 1604 can add cell delays to a signal or operation. To eliminate or reduce the cell delays, non-functioning cells can be used instead of the inverter cells 1602, 1604. The inverter cells 1602, 1604 are pass-through cells that are configured to receive signals from the diagonal metal conductor 1606 and transmit signals to the diagonal metal conductor 1606. FIG. 17 illustrates example non-functioning inverter cells in accordance with some embodiments. The frontside layer 1600 includes a non-functioning inverter cell 1700 and another non-functioning inverter cell 1702. The diagonal metal conductor 1606 on the backside metal layer 1608 connects the non-functioning inverter cell 1700 to the non-functioning inverter cell 1702.

In a non-limiting example, the non-functioning inverter cells 1700, 1702 include metal conductors and conductive paths between the metal conductors but do not have any functioning components (e.g., no active components). The metal conductors and the conductive paths are used to transmit signals between the cells 1612, 1616 on the frontside layer 1600 using the diagonal metal conductor 1606 on the backside metal layer 1608. An example routing structure for use in a non-functioning inverter cell is discussed in more detail in conjunction with FIGS. 18A-18C.

Figures 18A, 18B, 18C:
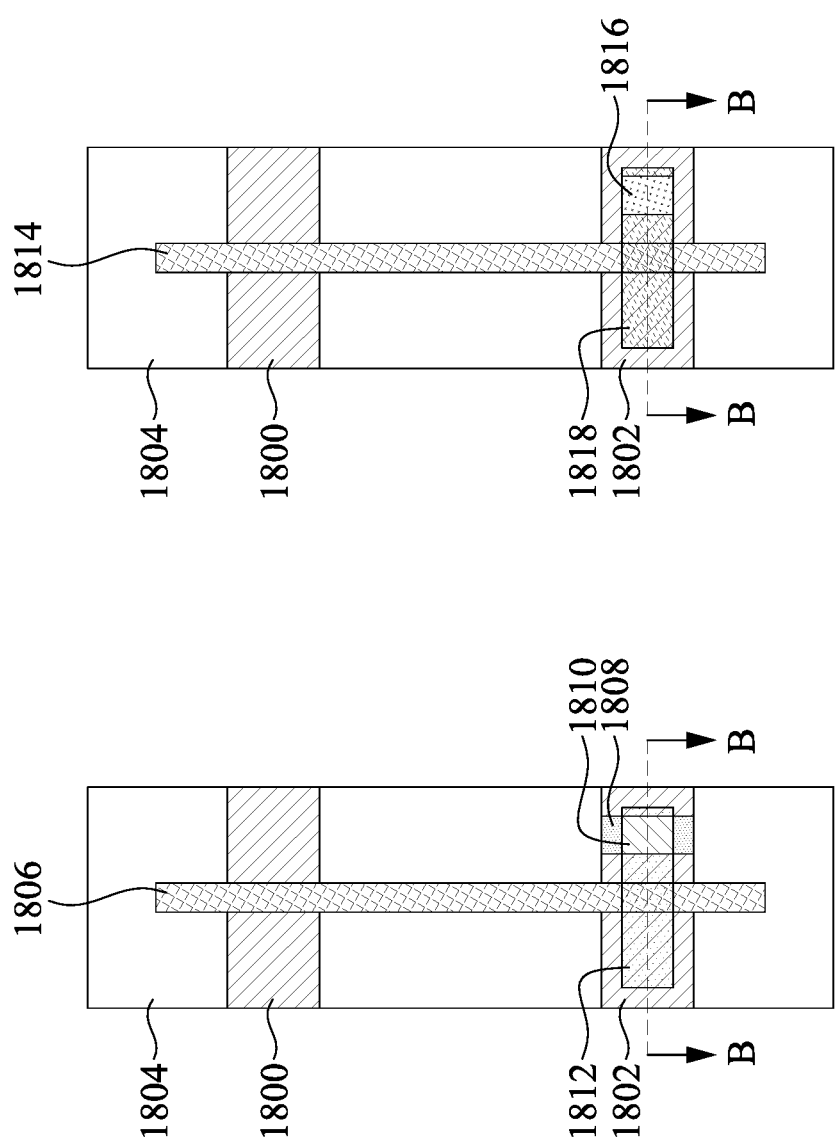
FIG. 18A depicts a frontside view of an example routing structure that is suitable for use with the non-functioning inverter cells shown in FIG. 17 in accordance with some embodiments.
FIG. 18B illustrates a backside view of the example routing structure shown in FIG. 18A in accordance with some embodiments.
FIG. 18C depicts a cross-sectional view of the example routing structure taken along line B-B in FIGS. 18A-18B in accordance with some embodiments.

FIG. 18A depicts a frontside view of an example routing structure that is suitable for use in the non-functioning inverter cells shown in FIG. 17 in accordance with some embodiments. FIG. 18C illustrates a cross-sectional view of the example routing structure taken along line B-B in FIGS. 18A-18B in accordance with some embodiments. FIG. 18A is described in conjunction with FIG. 18C.

Active diffusion regions 1800, 1802 are formed in a substrate 1804 and positioned along the x direction. The active diffusion regions 1800, 1802 are conducting regions that are formed on the substrate 1804 and are used to transmit signals between frontside and backside layers. A dummy polysilicon ("poly") line 1806 is disposed in the y direction over the active diffusion regions 1800, 1802 and the substrate 1804. Typically, a poly line serves as a gate electrode of a transistor, but the dummy poly line 1806 does not act as a gate electrode since the cell is a non-functioning inverter cell.

A conductive metal-to-diffusion ("MD") region 1808 is positioned over the active diffusion region 1802 in the y direction, and a conductive via-to-diffusion ("VD") region 1810 is disposed over the MD region 1808 in the x direction. The VD region 1810 connects to the MD region to connect a source/drain region in the active diffusion region 1802 to one or more metal conductors in a first frontside metal layer 1812 (e.g., frontside M0 layer). In one embodiment, the metal conductor(s) of the first frontside metal layer 1812 is routed according to Manhattan routing.

FIG. 18B depicts a backside view of the example routing structure shown in FIG. 18A in accordance with some embodiments. FIG. 18B is described in conjunction with FIG. 18C. A dummy poly line 1814 is disposed in they direction over the active diffusion regions 1800, 1802 and the substrate 1804. Typically, a poly line serves as a gate electrode of a transistor, but the dummy poly line 1814 does not act as a gate electrode since the cell is a non-functioning inverter cell.

A conductive via-to-buried power ("VB") region 1816 is positioned over the active diffusion region 1802 and connected to a diagonal metal conductor in the first backside metal layer 1818 (e.g., BM0 layer). The routing structure 1820 provides a path for signal transmission between one or more metal conductors in the first frontside metal layer 1812 and one or more metal conductors in the first backside metal layer 1818.

Figure 19:
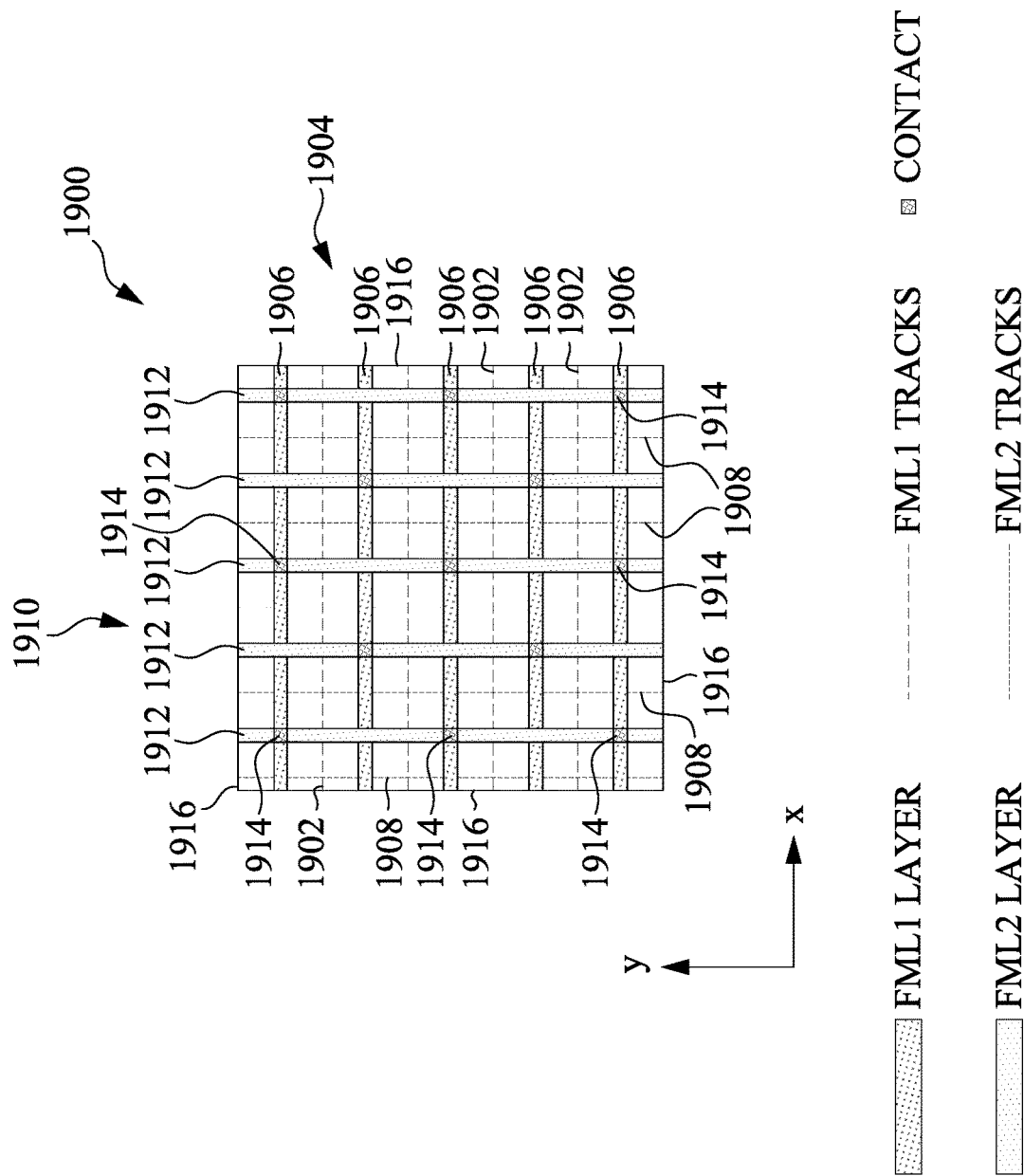
FIG. 19 illustrates a first example layout for a first frontside metal layer and a second frontside metal layer in accordance with some embodiments.

FIG. 19 illustrates a first example layout for a first frontside metal layer and a second frontside metal layer in an integrated circuit in accordance with some embodiments. The layout 1900 includes tracks 1902 disposed in the x direction for a first frontside metal ("FML1") layer 1904. In the illustrated embodiment, the metal conductors 1906 of the ML1 layer 1904 are positioned along some of the tracks 1902.

The layout 1900 further includes tracks 1908 disposed in they direction for a second frontside metal ("FML2") layer 1910. The FML2 layer 1910 is formed above the FML1 layer 1904. Metal conductors 1912 of the FML2 layer 1910 are positioned along some of the tracks 1908. Contacts 1914 electrically connect respective metal conductors 1912 to respective metal conductors 1906.

As shown, the tracks 1902, 1908, the metal conductors 1906, and the metal conductors 1912 are orthogonal to a design boundary 1916. As such, the routing of the metal conductors 1906, 1912 is known as Manhattan routing. In one embodiment, the FML1 layer 1904 is the frontside metal layer 104 and the FML2 layer 1910 is the frontside metal layer 106 shown in FIG. 1.

Figure 20:
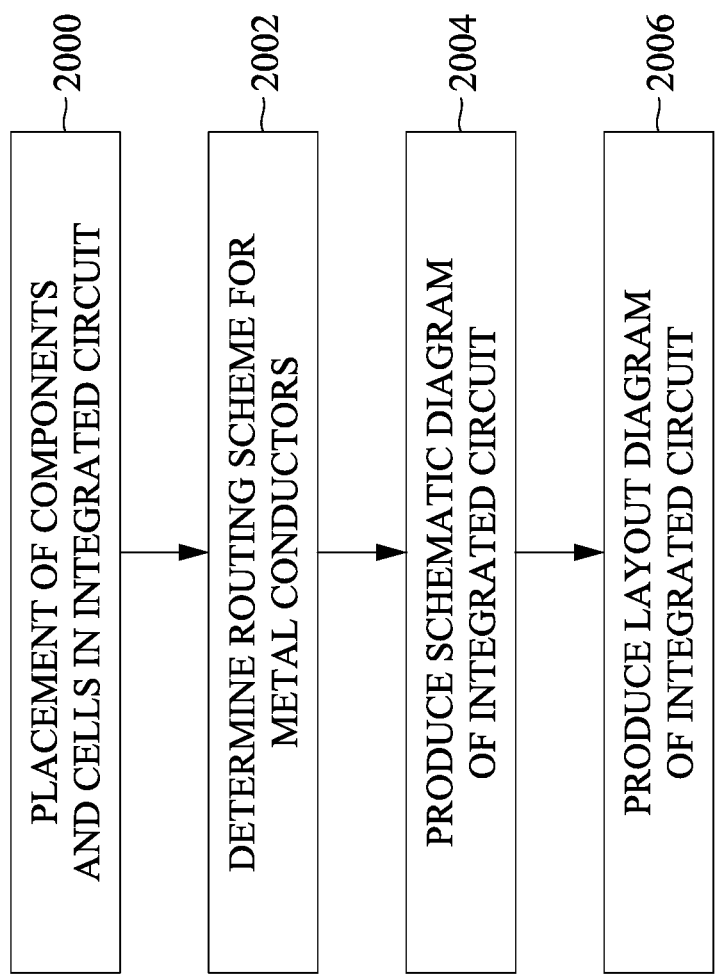
FIG. 20 depicts a flowchart of an example method of designing an integrated circuit in accordance with some embodiments.

FIG. 20 depicts a flowchart of an example method of designing an integrated circuit in accordance with some embodiments. Initially, as shown in block 2000, a placement operation is performed to determine the locations of the components and/or circuits in the cells as well as the locations of the cells in an IC. In some embodiments, the placement operation includes the placement determination shown in FIG. 15. Additionally or alternatively, the placement operation includes the placement of clock trees (e.g., FIGS. 3-6), the placement of the pins and the diagonal pins (FIGS. 7-8), the determination of the pitch of the metal conductors, the pins, and the diagonal pins (FIG. 9), the determination of the nets and/or the time critical nets (FIGS. 10-12), the use of a net bounding box as described in conjunction with FIGS. 13-14, and/or the operations of FIGS. 16-19.

Next, as shown in block 2002, a routing scheme for the metal conductors in the IC is determined. In one embodiment, the routing scheme determines the number of frontside metal layers and the number of backside metal layers to be used in a PDN to provide power signals and to provide signals to and from the components and cells in the integrated circuit. The determination of the routing scheme also determines which of the frontside and the backside metal layers are routed according to Manhattan routing and diagonal routing (e.g., see FIGS. 1-6 and 19). The operations performed in block 2002 can include some or all of the operations described in conjunction with FIGS. 7-17.

A schematic diagram of the IC is then produced at block 2004. The schematic diagram is based on the placement of the components/circuits and cells determined at block 2000 and the routing scheme determined at block 2002. Based on the schematic diagram, a layout diagram of the IC is produced at block 2006.

In some embodiments, a design for an IC is provided by a computer system such as an Electronic Computer-Aided Design (ECAD) system. ECAD tools and methods facilitate the design, partition, and placement of circuits and/or components in an IC on a semiconductor substrate. The ECAD process typically includes turning a behavioral description of an IC into a functional description, which is then decomposed into logic functions and mapped into cells that implement the logic or other electronic functions. Such cells may be defined and stored in a cell library. Once mapped, a synthesis is performed to turn the structural design into a physical layout. In some instances, the design may be optimized post layout.

Figure 21:
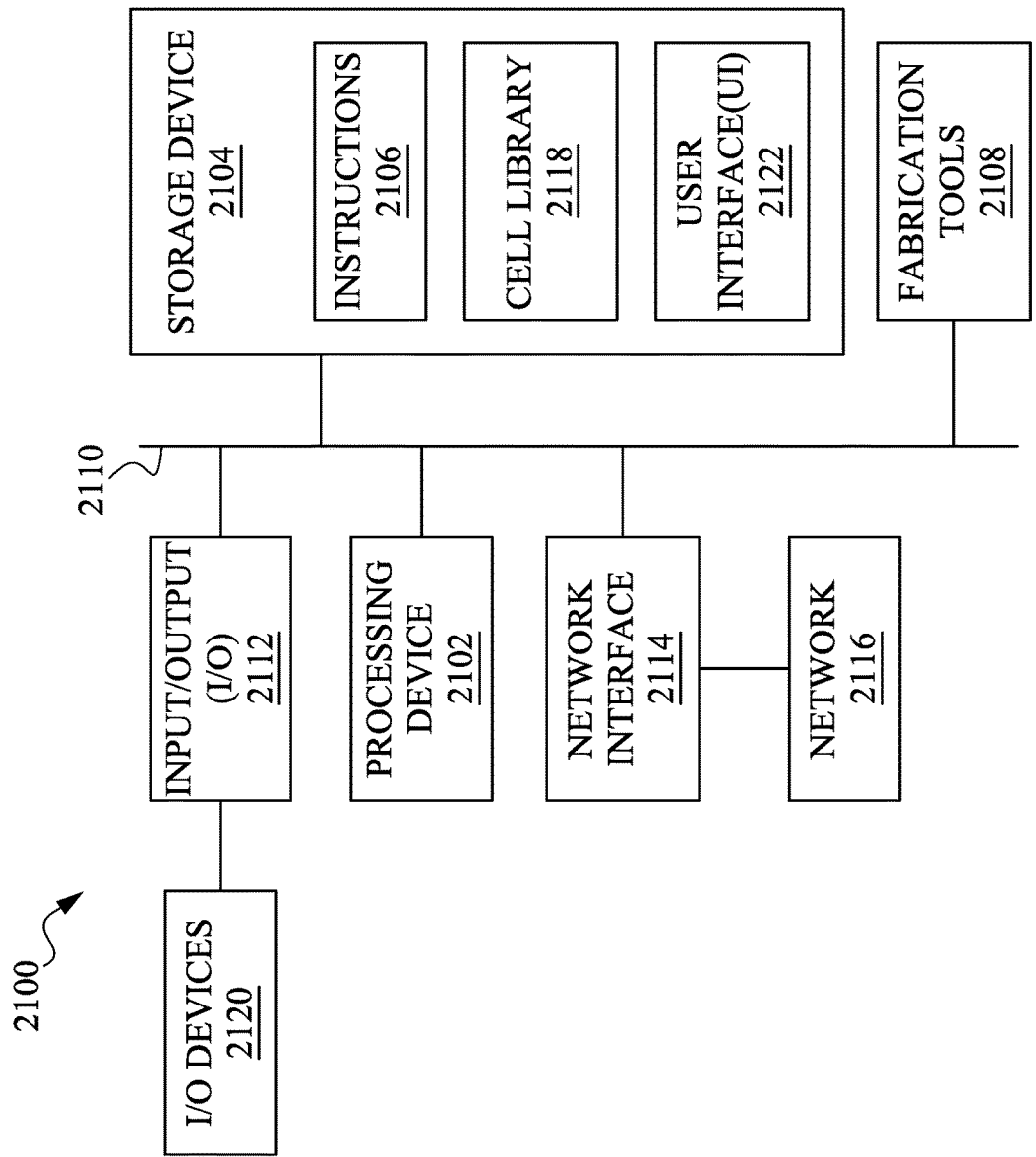
FIG. 21 depicts an example system that is suitable for designing an integrated circuit in accordance with some embodiments.

FIG. 21 depicts an example system that is suitable for designing an integrated circuit in accordance with some embodiments. The design process may be implemented by a computer system, such as an ECAD system. Some or all of the operations for design (e.g., layout) methods disclosed herein are capable of being performed as part of a design procedure performed in a design house, such as the design house 2302 discussed below in conjunction with FIG. 23.

In some embodiments, the system 2100 includes an automated place and route (APR) system. In some embodiments, the system 2100 includes a processing device 2102 and a non-transitory, computer-readable storage medium 2104 ("storage device"). The processing device 2102 is any suitable processing device or processing devices. Example processing devices include, but are not limited to, a central processing unit, a microprocessor, a distributed processing system, an application specific integrated circuit, a graphics processing unit, a field programmable gate array, or combinations thereof.

The storage device 2104 may be encoded with or store, for example, computer program code (e.g., a set of executable instructions 2106). Execution of the executable instructions 2106 by the processing device 2102 represents (at least in part) an ECAD tool that implements a portion or all of, the methods described herein to produce the designs for the structures and the ICs disclosed herein. Further, the fabrication tools 2108 may be included for layout and physical implementation of the ICs. In one or more embodiments, the storage device 2104 is an electronic, magnetic, optical, electromagnetic, infrared, and/or a semiconductor system (or apparatus or device). For example, the storage device 2104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the storage device 2104 includes a compact disk-read only memory (CD-ROM), a compact disk-read/write (CD-R/W), and/or a digital video disc (DVD).

The processing device 2102 is operably connected to the storage device 2104 via a bus 2110. The processing device 2102 is also operably connected to an input/output (I/O) interface 2112 and a network interface 2114 by the bus 2110. The network interface 2114 is operably connected to a network 2116 so that the processing device 2102 and the storage device 2104 are capable of connecting to external elements via the network 2116. In one or more embodiments, the network 2116 is illustrative of any type of wired and/or wireless network, such as an intranet and/or a distributed computing network (e.g., the Internet).

The network interface 2114 allows the system 2100 to communicate with other computing or electronic devices (not shown) via the network 2116. The network interface 2114 includes wireless network interfaces and/or wired network interfaces. Example wireless network interfaces include BLUETOOTH, WIFI, WIMAX, GPRS, or WCDMA. Example wired network interfaces include ETHERNET, USB, or IEEE-1364. In one or more embodiments, some or all of the processes and/or methods disclosed herein are implemented in a distributed system via the network 2116.

The processing device 2102 is configured to execute the executable instructions 2106 encoded in the storage device 2104 to cause the system 2100 to be usable for performing some or all of the processes and/or methods. For example, an electronic design application (e.g., in an ECAD system or as a standalone application) can be configured to perform the methods and techniques shown in FIGS. 3-20 and 22A-22B. Given the complexity of integrated circuits, and since integrated circuits include thousands, millions, or billions of components, the human mind is unable to perform the methods and techniques depicted in FIGS. 3-20 and 22A-22B. Unlike the human mind, an electronic design application is able to perform the operations associated with FIGS. 3-20 and 22A-22B.

In one or more embodiments, the storage device 2104 stores the executable instructions 2106 configured to cause the system 2100 to be usable for performing some or all of the processes and/or methods. In one or more embodiments, the storage device 2104 also stores information that facilitates execution of a portion of or all of the processes and/or methods. In one or more embodiments, the storage device 2104 stores a cell library 2118 that includes (at least in part) standard and/or previously designed cells.

The I/O interface 2112 is operably connected to I/O devices 2120. In one or more embodiments, the I/O devices 2120 include one or more of an image capture device, a microphone, a scanner, a keyboard, a keypad, a mouse, a trackpad, a touchscreen, and/or cursor direction keys for communicating information and commands to the processing device 2102. The I/O devices 2120 may also include one or more displays, one or more speakers, a printer, headphones, a haptic or tactile feedback device, and the like.

The system 2100 is configured to receive information through the I/O interface 2112. The information received through the I/O interface 2112 includes one or more of instructions, data, design rules, cell libraries, and/or other parameters for processing by the processing device 2102. The information is transferred to the processing device 2102 via the bus 2110. The system 2100 is configured to receive information related to a user interface (UI) through the I/O interface 2112. The information is stored in the storage device 2104 as a UI 2122 or for presentation in the UI 2122.

In some embodiments, a portion or all of the processes and/or methods is implemented as a standalone software application (e.g., an EDA) for execution by a processing device (e.g., processing device 2102). In some embodiments, a portion or all of the processes and/or methods is implemented as a software application that is a part of an additional software application. In some embodiments, a portion or all of the processes and/or methods is implemented as a plug-in to a software application. In some embodiments, at least one of the processes and/or methods is implemented as a software application that is a portion of an EDA tool. In some embodiments, a portion or all of the processes and/or methods is implemented as a software application that is used by the system 2100. In some embodiments, a layout diagram which includes standard and/or previously designed cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium (e.g., the storage device 2104). Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the system 2100 may include the fabrication tools 2108 for implementing the processes and/or methods stored in the storage device 2104. For instance, a synthesis may be performed on a design in which the behavior and/or functions desired from the design are transformed to a functionally equivalent logic gate-level circuit description by matching the design to cells selected from the cell library 2118. The synthesis results in a functionally equivalent logic gate-level circuit description, such as a gate-level netlist. Based on the gate-level netlist, a photolithographic mask may be generated that is used to fabricate the IC by the fabrication tools 2108. Further aspects of device fabrication are disclosed in conjunction with FIG. 23, which is a block diagram of an integrated circuit manufacturing system, and a manufacturing flow associated therewith, in accordance with some embodiments. In some embodiments, based on a layout diagram, at least one of: (a) one or more semiconductor masks; or (b) at least one component in a layer of a semiconductor IC is fabricated using the manufacturing system 2300.

Figure 22A:
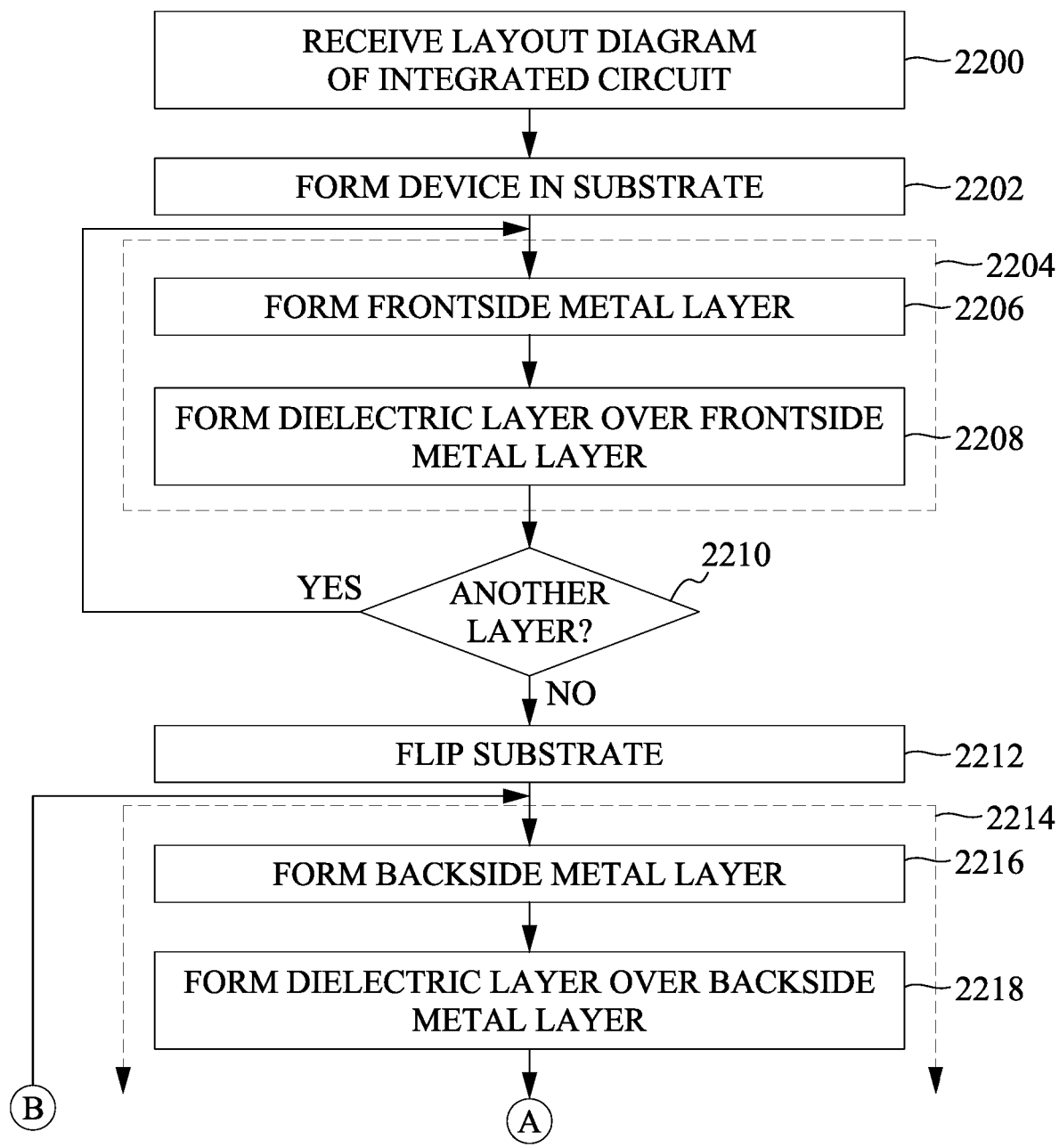
FIGS. 22A-22B illustrate a flowchart of a method of fabricating an integrated circuit in accordance with some embodiments.
Figure 22B:
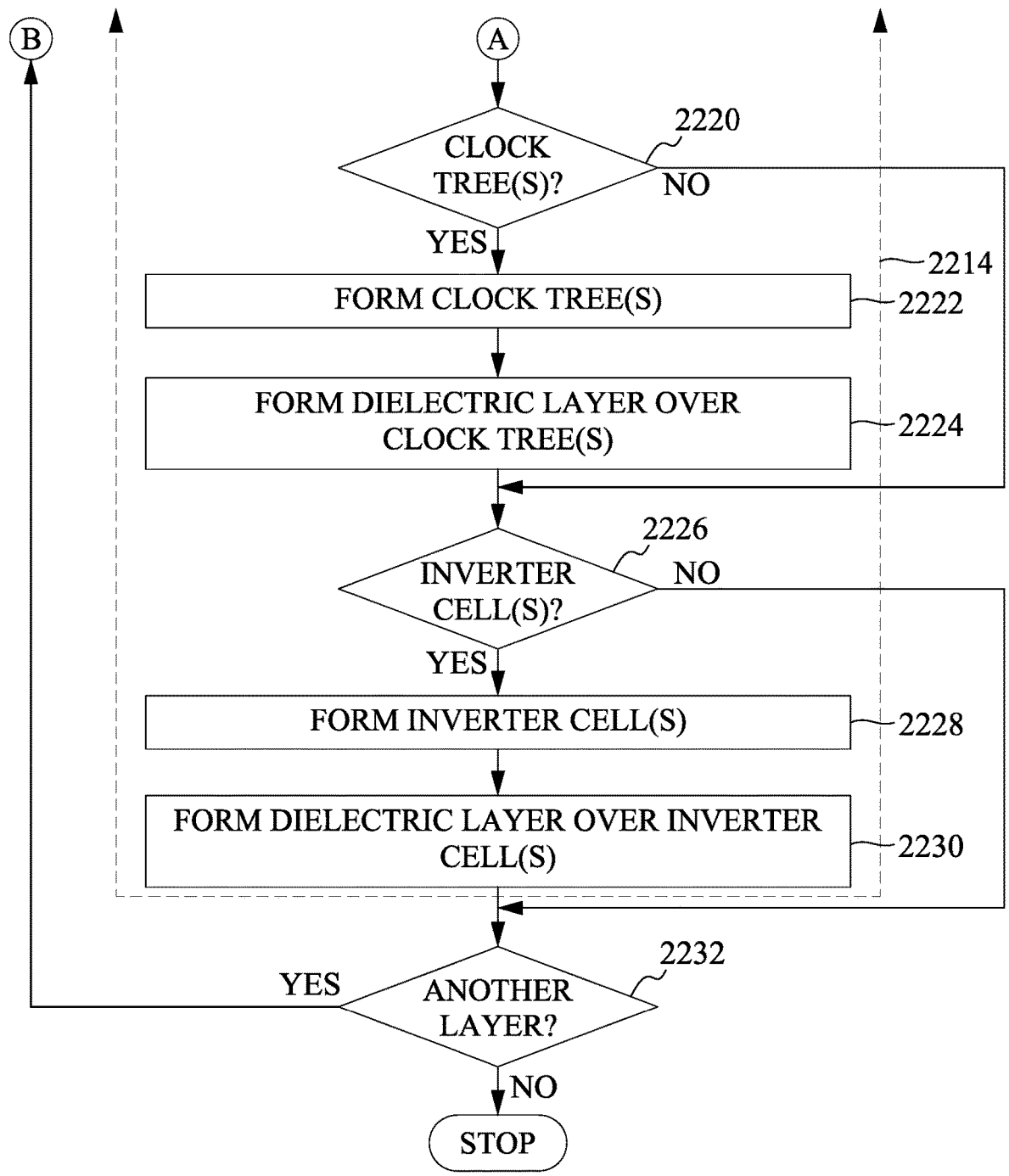

FIGS. 22A-22B illustrate a flowchart of a method of fabricating an integrated circuit in accordance with some embodiments. Initially, as shown in block 2200, a layout diagram for an IC is received. The layout diagram describes or defines a schematic of the IC, which includes the placement of components and cells (e.g., the device 102 in FIG. 1) in the IC and the routing scheme of the metal conductors in the IC. Once the device (e.g., the one or more circuits of the IC) is formed in, on and/or over a substrate in block 2202. The formation of the device includes producing active diffusion regions in the substrate. Any suitable substrate can be used for the device. An example substrate includes, but is not limited to, a silicon substrate, a gallium arsenide substrate, a silicon-on-insulator substrate, a gallium nitride substrate, and a silicon carbide substrate.

Next, as shown in block 2204, a frontside interconnect structure is formed on the frontside surface of the substrate (e.g., frontside interconnect structure 202 in FIG. 2). Although the frontside interconnect structure is described with reference to metal layers and metal conductors, other elements can be formed in the frontside interconnect structure. Elements such as polysilicon lines, VB regions, MD regions, and VD regions can be formed during the fabrication of the frontside interconnect structure.

Block 2204 includes block 2206 and block 2208. At block 2206, a frontside metal layer is formed. In one embodiment, forming the frontside metal layer includes forming the metal conductors for a PDN and for signals, forming any clock trees, forming the vias, and/or forming the pins in or on the frontside metal layer. In another embodiment, a backside metal layer includes the metal conductors and the pins and a separate backside metal layer is formed to produce the vias. Any suitable process can be used to form the frontside metal layer. For example, in one embodiment, a metal material is deposited over the structure and patterned (e.g., etched) to produce the metal conductors, the vias, and the pins. The metal material can be patterned by forming a mask layer over the metal material and developing the mask layer to form a mask that defines the locations of the metal conductors, vias, and pins.

After the frontside metal layer is formed at block 2206, a dielectric layer is formed over the frontside metal layer (block 2208). The dielectric layer is used to electrically isolate the metal conductors, vias, and pins. A determination is made at block 2210 as to whether another frontside metal layer is to be formed. If so, the process returns to block 2206 and blocks 2206 and 2208 repeat until all of the frontside metal layers are formed.

When a determination is made at block 2210 that another metal layer will not be formed, the method continues at block 2212 where the substrate is flipped such that a backside interconnect structure can be formed on the backside of the substrate (e.g., backside interconnect structure 204 in FIG. 2). At block 2214, a backside interconnect structure is formed on the backside surface of the substrate. Like the frontside interconnect structure, the backside interconnect structure is described with reference to metal layers and metal conductors. However, other elements can be formed in the backside interconnect structure, such as polysilicon lines, VB regions, MD regions, and VD regions.

Block 2214 includes block 2216, block 2218, block 2220, block 2222, block 2224, block 2226, block 2228, and block 2230. At block 2216, a backside metal layer is formed. In one embodiment, forming the backside metal layer includes forming the metal conductors for the PDN and for signals, forming any clock trees, forming the vias, and/or forming the pins in or on the backside metal layer. In another embodiment, a backside metal layer includes the metal conductors and the pins and a separate backside metal layer is formed to produce the vias. Any suitable process can be used to form the backside metal layer. For example, in one embodiment, a metal material is deposited over the structure and patterned (e.g., etched) to produce the metal conductors, the vias, and/or the pins. The metal material can be patterned by forming a mask layer over the metal material and developing the mask layer to form a mask that defines the locations of the metal conductors, vias, and/or pins.

After the backside metal layer is formed at block 2216, a dielectric layer is formed over the backside metal layer (block 2218). The dielectric layer is used to electrically isolate the metal conductors, vias, and pins. A determination is made at block 2220 as to whether one or more clock trees is to be formed (e.g., clock trees 310*a*, 310*b*, 310*c* in FIG. 3). If so, the process continues at block 2222 where the one or more clock trees is fabricated and operably connected to respective metal conductors in a backside metal layer (e.g., the backside metal layer formed at block 2216 or an underlying or overlying backside metal layer). Any suitable process can be used to form the clock tree(s). A dielectric layer is formed over and around the one or more clock trees at block 2224 to electrically isolate the clock tree(s).

When a determination is made at block 2220 that a clock tree will not be formed, or after block 2224 is performed, the process continues at block 2226. A determination is made at block 2226 as to whether one or more inverter cells is to be formed (e.g., inverter cells 1602, 1604 in FIG. 16). If so, the process continues at block 2228 where the one or more inverter cells is fabricated and operably connected to respective metal conductors in the backside metal layer formed at block 2216. Any suitable process can be used to form the inverter cell(s). A dielectric layer is formed over and around the one or more inverter cells at block 2230 to electrically isolate the inverter cell(s).

When a determination is made at block 2226 that an inverter cell will not be formed, or after block 2230 is performed, the process continues at block 2232. A determination is made at block 2232 as to whether another backside layer is to be formed. If so, the process returns to block 2216 and blocks 2216, 2218, 2220, 2226 and possible blocks 2222, 2224, 2228, 2230 repeat until all of the backside metal layers, clock trees, and inverter cells are formed. The method ends when all of the backside metal layers, clock trees, and inverter cells are formed.

Figure 23:
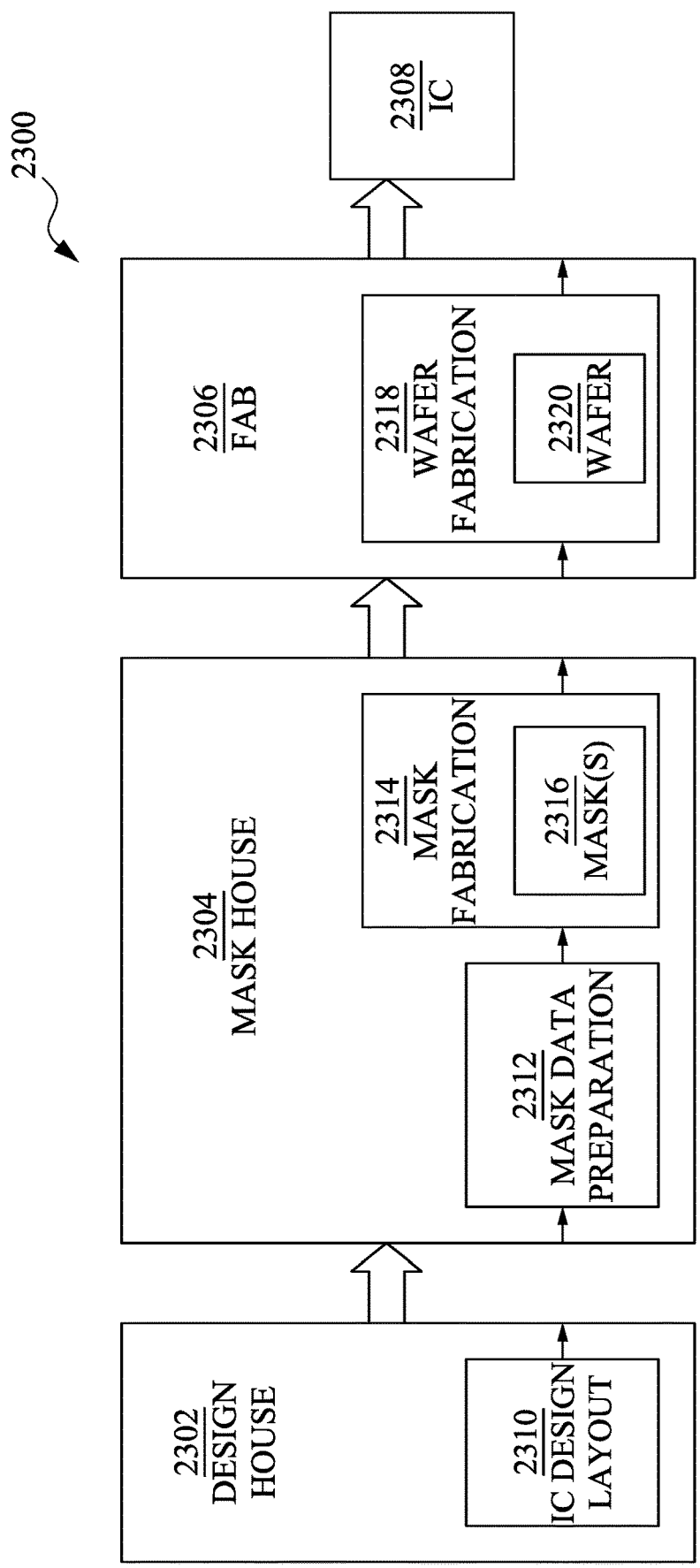
FIG. 23 illustrates a block diagram of an example integrated circuit manufacturing system and manufacturing flow in accordance with some embodiments.

FIG. 23 illustrates a block diagram of an example integrated circuit manufacturing system and manufacturing flow in accordance with some embodiments. In the illustrated embodiment, the IC manufacturing system 2300 includes entities, such as a design house 2302, a mask house 2304, and an IC manufacturer/fabricator ("fab") 2306, that interact with one another in the design, development, and manufacturing cycles and/or services related to manufacturing an IC 2308, such as the ICs disclosed herein. The entities in the system 2300 are operably connected by a communication network (not shown). In some embodiments, the communication network is a single network. In some embodiments, the communication network is a variety of different networks, such as an intranet and the Internet. The communication network includes wired and/or wireless communication channels.

Each entity interacts with one or more of the other entities and provides services to and/or receives services from one or more of the other entities. In some embodiments, two or more of the design house 2302, the mask house 2304, and the IC fab 2306 is owned by a single company. In some embodiments, two or more of the design house 2302, the mask house 2304, and the IC fab 2306 coexist in a common facility and use common resources.

The design house (or design team) 2302 generates an IC design layout diagram 2310. The IC design layout diagram 2310 includes various geometrical patterns, or IC layout diagrams designed for the IC 2308 to be fabricated. The geometrical patterns correspond to patterns of metal, oxide, or semiconductor layers that make up the various components of the IC 2308 to be fabricated. The various layers combine to form various IC features. For example, a portion of the IC design layout diagram 2310 includes various IC features, such as active diffusion regions, gate electrodes, source and drain, metal lines or local vias, and openings for bonding pads, to be formed in a semiconductor substrate (such as a silicon wafer) and various material layers disposed on the semiconductor substrate.

The design house 2302 implements a design procedure to form the IC design layout diagram 2310. The design procedure includes one or more of logic design, physical design or place and route. The IC design layout diagram 2310 is presented in one or more data files having information of the geometrical patterns. For example, the IC design layout diagram 2310 can be expressed in a GDS file format, a GDSII file format, or a DFII file format.

The mask house 2304 includes mask data preparation 2312 and mask fabrication 2314. The mask house 2304 uses the IC design layout diagram 2310 to manufacture one or more masks 2316 to be used for fabricating the various layers of the IC 2308 according to the IC design layout diagram 2310. The mask house 2304 performs mask data preparation 2312, where the IC design layout diagram 2310 is translated into a representative data file ("RDF"). The mask data preparation 2312 provides the RDF to the mask fabrication 2314. The mask fabrication 2314 includes a mask writer (not shown) that converts the RDF to an image on a substrate, such as a mask (reticle) 2316 on a semiconductor wafer. The IC design layout diagram 2310 is manipulated by the mask data preparation 2312 to comply with particular characteristics of the mask writer and/or requirements of the IC fab 2306. In FIG. 23, the mask data preparation 2312 and the mask fabrication 2314 are illustrated as separate elements. In some embodiments, the mask data preparation 2312 and the mask fabrication 2314 can be collectively referred to as a mask data preparation.

In some embodiments, the mask data preparation 2312 includes an optical proximity correction (OPC) that uses lithography enhancement techniques to compensate for image errors, such as those that can arise from diffraction, interference, other process effects and the like. The OPC adjusts the IC design layout diagram 2310. In some embodiments, the mask data preparation 2312 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 2312 includes a mask rule checker (MRC) (not shown) that checks the IC design layout diagram 2310 that has undergone processes in OPC with a set of mask creation rules that contain certain geometric and/or connectivity restrictions to ensure sufficient margins, to account for variability in semiconductor manufacturing processes, and the like. In some embodiments, the MRC modifies the IC design layout diagram 2310 to compensate for limitations during the mask fabrication, which may undo part of the modifications performed by OPC in order to meet mask creation rules.

In some embodiments, the mask data preparation 2312 includes lithography process checking (LPC) (not shown) that simulates processing that will be implemented by the IC fab 2306 to fabricate the IC 2308. LPC simulates this processing based on the IC design layout diagram 2310 to create a simulated manufactured device, such as the IC 2308. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, and if the simulated device is not sufficiently close in shape to satisfy design rules, OPC and/or MRC are be repeated to further refine the IC design layout diagram 2310.

It should be understood that the above description of the mask data preparation 2312 has been simplified for the purposes of clarity. In some embodiments, the mask data preparation 2312 includes additional features such as a logic operation (LOP) to modify the IC design layout diagram 2310 according to manufacturing rules. Additionally, the processes applied to the IC design layout diagram 2310 during the mask data preparation 2312 may be executed in a variety of different orders.

After the mask data preparation 2312 and during the mask fabrication 2314, a mask 2316 or a group of masks 2316 are fabricated based on the IC design layout diagram 2310. In some embodiments, the mask fabrication 2314 includes performing one or more lithographic exposures based on the IC design layout diagram 2310. In some embodiments, an electron-beam (e-beam) or a mechanism of multiple e-beams is used to form a pattern on a mask(s) 2316 (photomask or reticle) based on the IC design layout diagram 2310. The mask(s) 2316 can be formed in various technologies. For example, in some embodiments, the mask (s) 2316 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask(s) 2316 includes a transparent substrate (e.g., fused quartz) and an opaque material (e.g., chromium) coated in the opaque regions of the binary mask.

In another example, the mask(s) 2316 is formed using a phase shift technology. In a phase shift mask (PSM) version of the mask(s) 2316, various features in the pattern formed on the phase shift mask are configured to have a proper phase difference to enhance the resolution and imaging quality. In various examples, the phase shift mask can be attenuated PSM or alternating PSM. The mask(s) 2316 generated by the mask fabrication 2314 is used in a variety of processes. For example, a mask(s) 2316 is used in an ion implantation process to form various doped regions in the semiconductor wafer, in an etching process to form various etching regions in the semiconductor wafer, and/or in other suitable processes.

The IC fab 2306 includes wafer fabrication 2318. The IC fab 2306 is an IC fabrication business that includes one or more manufacturing facilities for the fabrication of a variety of different IC products. In some embodiments, the IC fab 2306 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 2306 uses the mask(s) 2316 fabricated by the mask house 2304 to fabricate the IC 2308. Thus, the IC fab 2306 at least indirectly uses the IC design layout diagram 2310 to fabricate the IC 2308. In some embodiments, a semiconductor wafer 2320 is fabricated by the IC fab 2306 using the mask(s) 2316 to form the IC 2308. In some embodiments, the IC fab 2306 includes performing one or more lithographic exposures based at least indirectly on the IC design layout diagram 2310. The semiconductor wafer 2320 includes a silicon substrate or other proper substrate having material layers formed thereon. The semiconductor wafer 2320 further includes one or more of various doped regions, dielectric features, multilevel interconnects, and the like (formed at subsequent manufacturing steps).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, an integrated circuit includes a device, a frontside metal layer positioned above the device, and a backside metal layer positioned below the device. The frontside metal layer includes a first plurality of metal conductors that transmit signals and one or more voltage sources. The metal conductors in the first plurality of metal conductors are routed according to Manhattan routing. The backside metal layer includes a clock tree operably connected to a second metal conductor that transmits clock signals, and a third plurality of metal conductors that transmit one or more voltage sources. The second metal conductor and the metal conductors in the third plurality of metal conductors are routed according to diagonal routing.

In another aspect, an integrated circuit includes a device, a frontside metal layer positioned above the device, and a backside metal layer positioned below the device. The frontside metal layer includes a first plurality of metal conductors that transmit signals and one or more voltage sources. The metal conductors in the first plurality of metal conductors are routed according to Manhattan routing. The backside metal layer includes a clock tree operably connected to a second metal conductor that transmits clock signals, a time critical net operably connected to a third metal conductor, and a fourth plurality of metal conductors that transmit one or more voltage sources. The second metal conductor, the third metal conductor, and the metal conductors in the fourth plurality of metal conductors are routed according to diagonal routing.

In yet another aspect, a method of fabricating an integrated circuit includes forming a device in a substrate of the integrated circuit. A backside interconnect structure is formed over a frontside surface of the substrate, where the operation of forming the frontside interconnect structure includes forming a frontside metal layer that includes a first plurality of metal conductors. The metal conductors in the first plurality of metal conductors are routed according to Manhattan routing and are configured to transmit signals and one or more power signals. A backside interconnect structure is formed over a backside surface of the substrate. The operation of forming the backside interconnect structure includes forming a first backside metal layer that includes a second plurality of metal conductors, forming one or more clock trees and operably connecting the one or more clock trees to respective metal conductors in the second plurality of metal conductors, and forming a second backside metal layer that includes a third plurality of metal conductors. Metal conductors in the second and in the third pluralities of metal conductors are routed according to diagonal routing and are configured to transmit the one or more power signals.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. An integrated circuit, comprising:
   a device;
   a frontside metal layer positioned above the device, the frontside metal layer comprising a first plurality of metal conductors configured to transmit signals and one or more power signals, wherein metal conductors in the first plurality of metal conductors are routed according to Manhattan routing; and
   a backside metal layer positioned below the device, the backside metal layer comprising:
      a clock tree operably connected to a second metal conductor configured to transmit clock signals; and
      a third plurality of metal conductors configured to transmit one or more power signals, wherein the second metal conductor and metal conductors in the third plurality of metal conductors are routed according to diagonal routing;
      wherein the frontside metal layer includes a first non-functioning inverter cell and a second non-functioning inverter cell, and the backside metal layer includes a diagonal metal conductor that operably connects the first non-functioning inverter cell to the second non-functioning invertor cell, the first non-functioning inverter cell operable to receive a signal from a first frontside cell and transmit the signal to the second non-function cell, and the second non-functioning inverter cell operable to transmit the signal to a second frontside cell.

2. The integrated circuit of claim 1, wherein:
   the backside metal layer comprises a first backside metal layer; and
   a clock tree in the plurality of clock trees is operably connected to a diagonal metal conductor on a second backside metal layer.

3. The integrated circuit of claim 1, further comprising, a time critical net operably connected to a third metal conductor of the backside metal layer.

4. The integrated circuit of claim 1, wherein the first frontside cell and the first non-functioning inverter cell include a routing structure configured to transmit the signal from the first frontside cell to the first non-functioning inverter cell.

5. The integrated circuit of claim 1, wherein the second frontside cell and the second non-functioning inverter cell include a routing structure configured to transmit the signal from the second non-functioning inverter cell to the second frontside cell.

6. The integrated circuit of claim 1, further comprising a second backside metal layer formed below the first backside metal layer, wherein the first backside metal layer includes pins and the second backside metal layer includes diagonal pins that are operably connected to the pins on the first backside metal layer.

7. The integrated circuit of claim 6, wherein a pitch of the diagonal pins on the second backside metal layer is based on a contacted polysilicon pitch of a plurality of polysilicon lines in a cell that includes the pins and the diagonal pins.

8. An integrated circuit, comprising:
a device;
a frontside metal layer positioned above the device, the frontside metal layer comprising a first plurality of metal conductors configured to transmit signals and one or more power signals, wherein metal conductors in the first plurality of metal conductors are routed according to Manhattan routing; and
a backside metal layer positioned below the device, the backside metal layer comprising:
a clock tree operably connected to a second metal conductor configured to transmit clock signals;
a time critical net operably connected to a third metal conductor; and
a fourth plurality of metal conductors configured to transmit one or more power signals, wherein the second metal conductor, the third metal conductor, and metal conductors in the fourth plurality of metal conductors are routed according to diagonal routing.

9. The integrated circuit of claim 8, wherein:
the backside metal layer comprises a first backside metal layer; and
a clock tree in the plurality of clock trees is operably connected to a diagonal metal conductor on a second backside metal layer.

10. The integrated circuit of claim 8, wherein the diagonal routing routes metal conductors in a first diagonal direction and in a second diagonal direction.

11. The integrated circuit of claim 8, wherein the backside metal layer includes a first non-functioning cell, a second non-functioning cell, and a diagonal metal conductor that operably connects the first non-functioning cell to the second non-functioning cell, the first non-functioning cell operable to receive a signal from a first frontside cell and transmit the signal to the second non-function cell, and the second non-functioning cell operable to transmit the signal to a second frontside cell.

12. The integrated circuit of claim 11, wherein the first frontside cell and the first non-functioning cell include a routing structure configured to transmit the signal from the first frontside cell to the first non-functioning cell.

13. The integrated circuit of claim 11, wherein the second frontside cell and the second non-functioning cell include a routing structure configured to transmit the signal from the second non-functioning cell to the second frontside cell.

14. The integrated circuit of claim 8, further comprising a second backside metal layer formed above the first backside metal layer, wherein the first backside metal layer includes pins and the second backside metal layer includes diagonal pins that are operably connected to the pins on the first backside metal layer.

15. The integrated circuit of claim 14, wherein a pitch of the diagonal pins on the second backside metal layer is based on a contacted polysilicon pitch of a plurality of polysilicon lines in a cell that includes the pins and the diagonal pins.

16. A method of fabricating an integrated circuit, the method comprising:
forming a device in a substrate of the integrated circuit;
forming a frontside interconnect structure over a frontside surface of the substrate, wherein forming the frontside interconnect structure comprises forming a frontside metal layer that includes a first plurality of metal conductors routed according to Manhattan routing and configured to transmit signals and one or more power signals;
forming a backside interconnect structure over a backside surface of the substrate, wherein forming the backside interconnect structure comprises:
forming a first backside metal layer that includes a second plurality of metal conductors routed according to diagonal routing and configured to transmit one or more power signals;
forming one or more clock trees and operably connecting the one or more clock trees to respective metal conductors in the second plurality of metal conductors;
forming a second backside metal layer that includes a third plurality of metal conductors routed according to diagonal routing and configured to transmit the one or more power signals; and
forming one or more inverter cells and operably connecting the one or more inverter cells to respective metal conductors in the second plurality of metal conductors.

17. The method of claim 16, further comprising:
forming a first dielectric layer over the first backside metal layer prior to forming the one or more clock trees;
forming a second dielectric layer over the one or more clock trees prior to forming the second backside metal layer; and
forming a third dielectric layer over the second backside metal layer.

18. The method of claim 16, further comprising operably connecting a time critical net to a third metal conductor of the backside metal layer.

19. The method of claim 16, further comprising:
forming a third backside metal layer that includes a fourth plurality of metal conductors routed according to diagonal routing and configured to transmit a signal; and
operably connecting a respective metal conductor in the third backside metal layer to a respective clock tree.

20. The method of claim 16, further comprising receiving a layout diagram of the integrated circuit prior to forming the device in the substrate.

* * * * *